United States Patent
Sasago et al.

(10) Patent No.: US 6,913,857 B2
(45) Date of Patent: Jul. 5, 2005

(54) EXPOSURE MASK, METHOD FOR MANUFACTURING THE MASK, AND EXPOSURE METHOD

(75) Inventors: Masaru Sasago, Hirakata (JP); Masayuki Endo, Izumi (JP); Tokushige Hisatsugu, Chofu (JP)

(73) Assignees: Matsushita Electric Industrial Co., Ltd., Osaka (JP); PD Service Corporation, Tokyo (JP)

(*) Notice: Subject to any disclaimer, the term of this patent is extended or adjusted under 35 U.S.C. 154(b) by 373 days.

(21) Appl. No.: 10/168,963

(22) PCT Filed: Dec. 26, 2001

(86) PCT No.: PCT/JP01/11475

§ 371 (c)(1),
(2), (4) Date: Jun. 25, 2002

(87) PCT Pub. No.: WO02/052622

PCT Pub. Date: Jul. 4, 2002

(65) Prior Publication Data

US 2002/0192573 A1  Dec. 19, 2002

(30) Foreign Application Priority Data

Dec. 26, 2000 (JP) ....................... 2000-404600

(51) Int. Cl.⁷ .............................. G03F 9/00; G03C 5/00
(52) U.S. Cl. ........................................... 430/5; 430/296
(58) Field of Search ............................... 430/5, 296, 30

(56) References Cited

U.S. PATENT DOCUMENTS

| 4,916,322 A | 4/1990 | Glavish et al. |
| 5,814,423 A | 9/1998 | Maruyama et al. |
| 6,214,498 B1 | 4/2001 | Choi |
| 6,316,151 B1 | 11/2001 | Kim et al. |

FOREIGN PATENT DOCUMENTS

| GB | 2 351 567 A | 1/2001 |
| JP | 05-326381 A | 12/1993 |
| JP | 6-5499 A | 1/1994 |
| JP | 06-05499 A | 1/1994 |
| JP | 2000-188254 A | 7/1999 |
| JP | 2000-188254 | 7/2000 |
| KR | 2000-0060497 | 10/2000 |

Primary Examiner—Mark F Huff
Assistant Examiner—Saleha Mohamedulla
(74) Attorney, Agent, or Firm—McDermott Will & Emery LLP

(57) ABSTRACT

As shown in FIG. 2, a multi-layer structured exposure mask 1 of this embodiment is provided with a frame 20 made of glass, a silicon plate 15 provided on an under surface of the frame 20, a heat absorption mask 16 provided on an under surface of the silicon plate 15, a silicon plate 11 provided on an under surface of the heat absorption mask 16 and a stencil mask 14 provided on an under surface of the silicon plate 11. The stencil mask 14 is made up of a silicon substrate and is provided with a slit-shaped patterning opening 14a to form a resist pattern. The heat absorption mask 16 is made up of a silicon substrate coated with an SiN film and is provided with slit-shaped openings 16a shaped in almost the same way as the patterning openings 14a of the stencil mask 14. The opening 16a is shaped in such a size that will not block electron beams necessary to form a resist pattern as shown in FIG. 3(a). That is, a size of the opening 16a is equal to a size of the patterning opening 14a or a size of the opening 16a is a little larger Furthermore, the multi-layer structured exposure mask 1 of this embodiment is provided with a large opening 20a that penetrates the frame 20 and silicon plate 15 and exposes the area of the upper surface of the heat absorption mask 16 in which the openings 16a are formed. Furthermore, the multi-layer structured exposure mask 1 of this embodiment is provided with a hollow section 11a that penetrates the silicon plate 11 and exposes the area of the under surface of the heat absorption mask 16 in which the openings 16a are formed and the area of the upper surface of the stencil mask 14 in which the patterning openings 14a are formed. In the multi-layer structured exposure mask 1 of this embodiment, the patterning openings 14a of the stencil mask 14 and the openings 16a of the heat absorption mask 16 are aligned in the horizontal direction as shown in FIG. 3(a).

38 Claims, 26 Drawing Sheets

IRRADIATION OF X-RAYS

DRY ETCHING

IRRADIATION OF X-RAYS

EXPOSURE MASK, METHOD FOR MANUFACTURING THE MASK, AND EXPOSURE METHOD

TECHNICAL FIELD

The present invention relates to a charged particle beam exposure mask and X-ray exposure mask in a process of manufacturing an LSI, etc.

BACKGROUND ART

In line with miniaturization of patterns of LSI elements, there is a demand for a new exposure technology. A method for exposure to X-rays, electron beams or ion beams used in recent years uses a thin stencil mask with openings corresponding to patterns of their respective LSI elements.

According to a conventional electron beam exposure apparatus, a resist, which is applied to a silicon wafer and photosensitive to electron beams, is irradiated with electron beams through an exposure mask. At this time, the resist in an area corresponding to an opening provided in an exposure mask causes a photoreaction due to electron beams, which have passed through the opening.

"Photoreaction" is a term indicating a physical or chemical change in a matter that occurs when light beams or X-rays act on the matter, and in the present Specification, it is also used as a term indicating a physical or chemical change in a matter that occurs when electron beams or ion beams act on the matter. That is, the term "photoreaction" in the present Specification indicates a physical or chemical change in a matter that occurs when radiation acts on the matter.

FIG. 26 is a cross-sectional view of a conventional electron beam exposure mask. As shown in FIG. 26, an electron beam exposure mask 51 is constructed of a frame 20 made of glass, etc. a silicon plate 11 provided on the under surface of the frame 20 and a stencil mask 14 provided on the under surface of the silicon plate 11. The stencil mask 14 is formed of a silicon plate coated with SiC or diamond, etc. and provided with patterning openings 14a to form resist patterns. Furthermore, the electron beam exposure mask 51 is provided with a large opening 20a, which penetrates the frame 20 and silicon plate 11 and exposes the area of the upper surface of the stencil mask 14 in which the patterning openings 14a are formed.

FIG. 27 is a cross-sectional view of the X-ray exposure mask 51 used for a conventional X-ray exposure apparatus. As shown in FIG. 27, an X-ray exposure mask 52 is constructed of a frame 20 made of glass, etc., a silicon plate 11 provided on the under surface of the frame 20, a membrane 12 provided on the under surface of the silicon plate 11 and an X-ray shielding metal film 13 provided on the under surface of the membrane 12. The membrane 12 is formed of SiC or diamond, etc. and the X-ray shielding metal film 13 is provided with patterning openings 13a that penetrate the X-ray shielding metal film 13 to form resist patterns. Furthermore, the X-ray exposure mask 52 is provided with a large opening 20a, which penetrates the frame 20 and silicon plate 11 and exposes the area of the upper surface of the membrane 12 located above the area in which the patterning openings 13a of the X-ray shielding metal film 13 are formed.

In the case where a resist 62 is irradiated with electron beams using the conventional electron beam exposure mask 51, if an acceleration voltage for electron beams is small, it is not possible to cause a photoreaction of the resist in the area irradiated with electron beams completely. That is, the surface of the resist of the area irradiated with electron beams causes a photoreaction, but it is difficult to expose the entire resist in the depth direction of the area irradiated with electron beams. To initiate the photoreaction over the entire resist in the film thickness direction of the area irradiated with electron beams requires the acceleration voltage of electron beams to be increased.

However, the energy of accelerated electrons increases as the acceleration voltage increases. When electrons with such high energy collide with the stencil mask 14 of the exposure mask 51, the stencil mask 14 generates heat and expands. This deforms the stencil mask 14. This causes a problem such as preventing the resist from being subject to a photoreaction according to the patterning openings 14a provided on the stencil mask 14.

The same applies to a case where an X-ray photoresist is exposed to X-rays using the conventional X-ray exposure mask 52. When irradiated with strong X-rays such as synchrotron radiation (hereinafter referred to as "SOR light"), the membrane 12 and X-ray shielding metal film 13 are deformed by expansion as in the case of heat generation with electron beams.

DISCLOSURE OF THE INVENTION

The present invention has been achieved to solve the problems described above and it is an object of the present invention to provide an exposure mask with reduced deformation due to heat generation.

The exposure mask of the present invention includes a patterning mask having an opening and at least one heat absorption mask having an opening and placed above the patterning mask apart from the patterning mask and the opening of the patterning mask is aligned with the opening of the heat absorption mask.

According to the exposure mask of the present invention, the heat absorption mask blocks most of radiation irradiated onto the patterning mask. This suppresses heat generation of the patterning mask due to radiation. Furthermore, since the heat absorption mask is placed apart from the patterning mask, heat generated at the heat absorption mask is not transmitted to the patterning mask. This suppresses deformation by thermal expansion of the patterning mask.

It is preferable that the size of the opening of the heat absorption mask is greater than or equals to that of the opening of the patterning mask.

This prevents the heat absorption mask from blocking the opening of the patterning mask.

The openings of the heat absorption mask and patterning mask may be slit-shaped and the width of the opening of the heat absorption mask may be greater than or equal to the width of the opening of the patterning mask.

It is preferable that thermal conductivity of the heat absorption mask is greater than that of the patterning mask.

This allows the heat absorption mask to absorb heat efficiently.

It is preferable that a plurality of the heat absorption masks is provided and the openings of the respective heat absorption masks are aligned with the opening of the patterning mask.

This increases the efficiency of heat absorption by a plurality of the heat absorption masks.

It is preferable that the thickness of the heat absorption mask is greater than the thickness of the patterning mask.

This increases thermal conductivity of the heat absorption mask and allows the heat absorption mask to absorb heat efficiently.

The patterning mask and heat absorption mask may be made of the same material.

It is preferable that the exposure mask further includes a metal cover having an opening larger than the opening of the heat absorption mask, and the metal cover is placed above the heat absorption mask.

This allows the metal cover to absorb heat.

An alignment opening may be formed on the patterning mask and an opening in a shape different from the alignment opening and larger than the alignment opening may be formed in an area of the heat absorption masks located right above the alignment opening.

It is also possible to adopt a configuration further including a support for supporting the edges of the patterning mask and the heat absorption mask, and both the patterning mask and the heat absorption mask are placed either above or below the support.

It is also possible to adopt a configuration further including a support for supporting the edges of the patterning mask and the heat absorption mask, and the patterning mask and the heat absorption mask are placed in such a way that the support is inserted between the patterning mask and the heat absorption mask.

It is preferable that the support further includes a concave section and the heat absorption mask is engaged with the concave section and is positioned in the concave section.

This securely fixes the heat absorption mask and makes it easier to exactly align the opening of the heat absorption mask with the opening of the patterning mask.

It is preferable that the support further includes a concave section and the patterning mask is engaged with the concave section and is positioned in the concave section.

This securely fixes the patterning mask and makes it easier to exactly align the opening of the heat absorption mask with the opening of the patterning mask.

It is also possible to adopt a configuration including a hollow section between the patterning mask and heat absorption mask formed by etching a member between the patterning mask and heat absorption mask.

It is also possible to provide a membrane on the upper surface of the patterning mask.

The exposure method of the present invention is an exposure method for irradiating charged particles using an exposure mask including a patterning mask having an opening and at least one heat absorption mask having an opening and placed above the patterning mask apart from the patterning mask with the opening of the patterning mask aligned with the opening of the heat absorption mask, characterized in that the charged particles are irradiated at an acceleration voltage of 10 keV or above.

According to the exposure mask used in the exposure method of the present invention, the heat absorption mask blocks most of charged particles irradiated onto the patterning mask out of the charged particles accelerated at an acceleration voltage of 10 keV or above. This suppresses heat generation of the patterning mask due to irradiation of charged particles. Since the heat absorption mask is also placed apart from the patterning mask, the heat generated from the heat absorption mask is not transmitted to the patterning mask. Therefore, deformation by thermal expansion of the patterning mask is suppressed.

The exposure method of the present invention even in a configuration with charged particles irradiated at an acceleration voltage of 50 keV or above suppresses deformation by thermal expansion of the patterning mask.

It is also possible to adopt a configuration using another exposure mask including a patterning mask having an opening and at least one heat absorption mask having an opening and placed above the patterning mask apart from the patterning mask with the opening of the patterning mask aligned with the opening of the heat absorption mask, and in that the opening pattern of the patterning mask of the exposure mask is different from the opening pattern of the patterning mask of the other exposure mask.

The exposure method of the present invention is an exposure method for irradiating X-rays using an exposure mask including a patterning mask having an opening, at least one heat absorption mask having an opening and placed above the patterning mask apart from the patterning mask and a membrane for supporting the pattering mask, with the opening of the patterning mask aligned with the opening of the heat absorption mask, characterized in that the patterning mask is formed of such a material as to prevent X-rays from penetrating.

According to the exposure mask used in the exposure method of the present invention, the heat absorption mask blocks most of X-rays irradiated onto the patterning mask. This suppresses heat generation of the patterning mask due to irradiation with X-rays. Furthermore, since the heat absorption mask is placed apart from the patterning mask, heat generated at the heat absorption mask is not transmitted to the patterning mask. This suppresses deformation of the patterning mask by thermal expansion.

Deformation of the patterning mask by thermal expansion can also be suppressed even using SOR-X-rays as X-rays.

It is also possible to adopt a configuration using another exposure mask including a patterning mask having an opening, at least one heat absorption mask having an opening and placed above the patterning mask apart from the patterning mask and a membrane for supporting the pattering mask, with the opening of the patterning mask aligned with the opening of the heat absorption mask and with the patterning mask formed of such a material as to prevent X-rays from penetrating, and in that the opening pattern of the patterning mask of the exposure mask is different from the opening pattern of the patterning mask of the other exposure mask.

The method for manufacturing an exposure mask of the present invention includes a step (a) of preparing a patterning mask having an opening and a heat absorption mask having an opening in almost the same pattern as the opening pattern of the patterning mask, and a step (b) of aligning the opening of the patterning mask with the opening of the beat absorption mask.

This provides an exposure mask with reduced deformation of the patterning mask by thermal expansion.

The patterning mask may be formed of a laminated film of a membrane and an X-ray shielding material.

The method for manufacturing an exposure mask of the present invention includes a step (a) of preparing a heat absorption mask having an opening, a step (b) of placing a patterning mask substrate below the heat absorption mask, a step (c) of stacking a resist on the under surface of the patterning mask substrate, a step (d) of patterning the resist by irradiating radiation penetrating the patterning mask substrate onto the resist using the heat absorption mask as the mask, and a step (e) of forming a patterning mask having an opening by etching the patterning mask substrate using the resist as the mask.

This provides an exposure mask with reduced deformation of the patterning mask by thermal expansion.

In the process (b), it is also possible to insert a support between the heat absorption mask and the patterning mask substrate.

The method for manufacturing an exposure mask of the present invention includes a step (a) of preparing a heat absorption mask having an opening, a step (b) of providing a plate on the under surface of the heat absorption mask, a step (c) of providing the patterning mask substrate on the under surface of the plate, a step (d) of forming a patterning mask having an opening by etching the plate and the patterning mask substrate using the heat absorption mask as the mask, and a step (e) of removing a part of the plate located in an area in which the openings of the heat absorption mask and patterning mask are formed.

This provides an exposure mask with reduced deformation of the patterning mask by thermal expansion.

In the step (e), it is preferable that the material making up the plate has a higher etching speed than the heat absorption mask and the patterning mask substrate.

This makes it possible to easily form a hollow section between the patterning mask and heat absorption mask without any damage due to etching to the patterning mask and heat absorption mask.

The method for manufacturing an exposure mask of the present invention includes a step (a) of placing a heat absorption mask having an opening above the patterning mask substrate on the upper surface of which a resist is formed, a step (b) of patterning the resist using the heat absorption mask as the mask, and a step (c) of forming a patterning mask having an opening by etching the patterning mask substrate using the resist as the mask.

This provides an exposure mask with reduced deformation of the patterning mask by thermal expansion.

In the step (a), it is also possible to place the heat absorption mask above the patterning mask substrate after forming the resist on the upper surface of the patterning mask substrate.

In the step (a), it is also possible to place a patterning mask substrate on the upper surface of which a resist is formed beforehand below the heat absorption mask after placing the heat absorption mask.

In the step (a), it is also possible to adopt a configuration that a support is placed to support the edges of the patterning mask substrate and the heat absorption mask and the heat absorption mask is engaged with the support.

The method for manufacturing an exposure mask of the present invention includes a step (a) of placing a patterning mask having an opening above a heat absorption mask substrate on the upper surface of which a resist is formed, a step (b) of patterning the resist using the patterning mask as the mask, a step (c) of placing the heat absorption mask substrate above the patterning mask, and a step (d) of forming a heat absorption mask having an opening by etching the heat absorption mask substrate using the resist as the mask.

This provides an exposure mask with reduced deformation of the patterning mask by thermal expansion.

In the step (a), it is also possible to place the patterning mask above the heat absorption mask after forming the resist on the upper surface of the heat absorption mask substrate.

In the step (a), it is also possible to place the heat absorption mask substrate on the upper surface of which a resist is formed beforehand below the patterning mask after placing the patterning mask.

It is also possible to adopt a configuration wherein a support is placed to support the edges of the patterning mask and the heat absorption mask substrate, the patterning mask is engaged with the support, and in the step (c), the heat absorption mask substrate is engaged with the support.

It is also possible to adopt a configuration repeating the steps (b) and (c).

A step (f) of placing a metal cover having an opening larger than the opening of the heat absorption mask above the heat absorption mask may be further included after the step (d).

The exposure mask manufacturing method of the present invention includes a step (a) of placing a patterning mask having an opening above the heat absorption mask substrate on the upper surface of which a resist is formed, a step (b) of patterning the resist using the patterning mask as the mask, a step (c) of forming a heat absorption mask having an opening by etching the heat absorption mask substrate using the resist as the mask, and a step (d) of placing the heat absorption mask above the patterning mask.

This provides an exposure mask with reduce deformation of the patterning mask by thermal expansion.

In the step (a), it is also possible to place the patterning mask above the heat absorption mask substrate after forming a resist on the upper surface of the heat absorption mask.

In the step (a), it is also possible to place the heat absorption mask substrate on the upper surface of which a resist is formed beforehand below the patterning mask after placing the patterning mask.

It is also possible to adopt a configuration that in the step (a), a support is placed to support the edges of the patterning mask and the heat absorption mask substrate, the patterning mask is engaged with in the support, and in the step (d), the heat absorption mask is engaged with in the support.

It is also possible to adopt a configuration repeating the steps (b) and (c).

It is also possible to adopt a configuration that a step (f) of placing a metal cover having an opening larger than the openings of the heat absorption mask above the heat absorption mask is further included after the step (d).

BEST MODE FOR CARRYING OUT THE INVENTION

Figure 1:
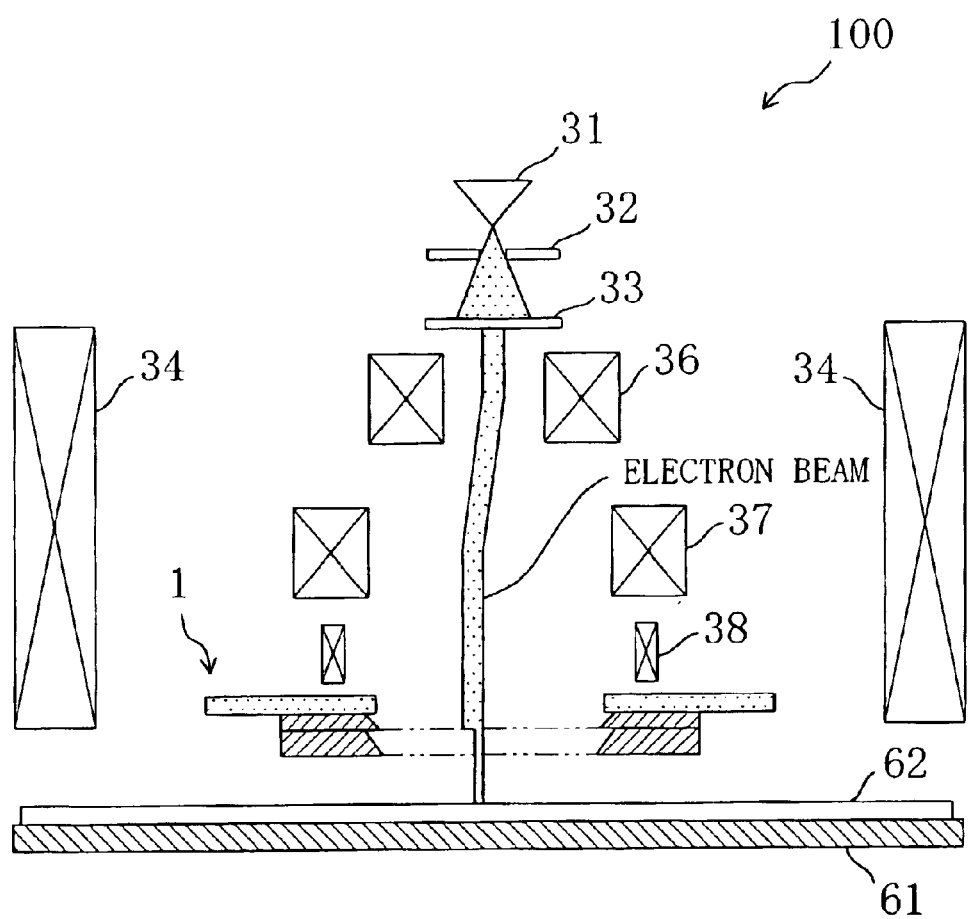
FIG. 1 is a cross-sectional view showing a configuration of an electron beam exposure apparatus using electron beams as a light source (hereinafter referred to as "EB exposure apparatus").

With reference now to the attached drawings, embodiments of the present invention will be explained below. For simplicity, components common to the embodiments are assigned the same reference numerals.

Embodiment 1

This embodiment will be explained with reference to FIG. 1. FIG. 1 is a cross-sectional view showing a configuration of an electron beam exposure apparatus using electron beams as a light source (hereinafter referred to as "EB exposure apparatus").

Configuration of EB Exposure Apparatus

As shown in FIG. 1, an EB exposure apparatus 100 is provided with an electron gun 31, a beam extracting electrode 32, an electron beam forming aperture 33, a charged beam focusing electromagnetic field generator 34, a first main deflector 36, a second main deflector 37, a fine adjustment deflector 38 and a multi-layer structured exposure mask 1.

When an acceleration voltage is applied at the beam extracting electrode 32, electron beams are extracted from the electron gun 31. The electron beams extracted from the electron gun 31 are converted to shaped electron beams by the electron beam forming aperture 33.

Then, the electron beams pass through an electromagnetic field of the charged beam focusing electromagnetic field generator 34 provided to prevent the electron beams from scattering. To move the irradiation area of the electron beams, the first main deflector 36, the second main deflector 37 and the fine adjustment deflector 38 deflect the electron beams. The first main deflector 36 deflects the electron beams up to a desired position and the second main deflector 37 inversely deflects the electron beams so that the electron beams are vertically irradiated onto the surface of a silicon wafer 61. The fine adjustment deflector 38 adjusts deflection in detail.

Then, the electron beams pass through the patterning opening provided on the multi-layer structured exposure mask 1 and are irradiated onto an area of a resist 62 applied to the silicon wafer 61 corresponding to the patterning opening.

Configuration of Multi-Layer Structured Exposure Mask

Figure 2:
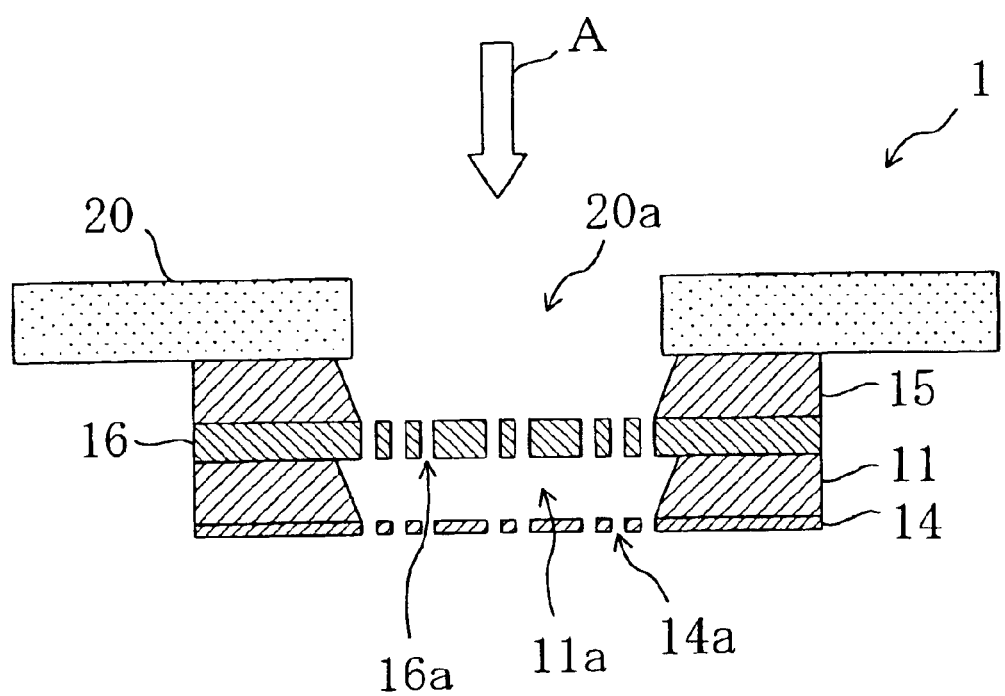
FIG. 2 is a cross-sectional view showing a configuration of a multi-layer structured exposure mask according to Embodiment 1.

Then, the multi-layer structured exposure mask 1 of this embodiment will be explained with reference to FIG. 2 and FIG. 3. FIG. 2 is a cross-sectional view of the multi-layer structured exposure mask 1 according to this embodiment. FIG. 3($a$) is a top view of the multi-layer structured exposure mask 1 according to this embodiment and the sectional view along line III—III in the drawing corresponds to FIG. 2. FIG. 3($b$) is an enlarged view of a part encircled with a circle C shown in FIG. 3($a$).

As shown in FIG. 2, the multi-layer structured exposure mask 1 of this embodiment is provided with a frame 20 made of glass, a silicon plate 15 provided on the under surface of the frame 20, a heat absorption mask 16 provided on the under surface of the silicon plate 15, a silicon plate 11 provided on the under surface of the heat absorption mask 16 and a stencil mask 14 provided on the under surface of the silicon plate 11.

The stencil mask 14 is made up of a silicon substrate and is provided with a slit-shaped patterning openings 14$a$ to form resist patterns.

The heat absorption mask 16 is made up of a silicon substrate coated with an SiN film and is provided with slit-shaped openings 16$a$ shaped almost in the same way as the patterning openings 14$a$ of the stencil mask 14. The opening 16$a$ is shaped in a size that will not block electron beams necessary to form a resist pattern as shown in FIG. 3($a$). That is, the size of the opening 16$a$ is equal to the size of the patterning opening 14$a$ or the size of the opening 16$a$ is a little larger.

Furthermore, the multi-layer structured exposure mask 1 of this embodiment is provided with a large opening 20$a$ that penetrates the frame 20 and silicon plate 15 and exposes the areas of the upper surface of the heat absorption mask 16 in which the openings 16$a$ are formed.

Furthermore, the multi-layer structured exposure mask 1 of this embodiment is provided with a hollow section 11a, which penetrates the silicon plate 11 and exposes an area of the under surface of the heat absorption mask 16 in which the patterning openings 16a are formed and an area of the upper surface of the stencil mask 14 in which the patterning openings 14a are formed.

Figure 3A:
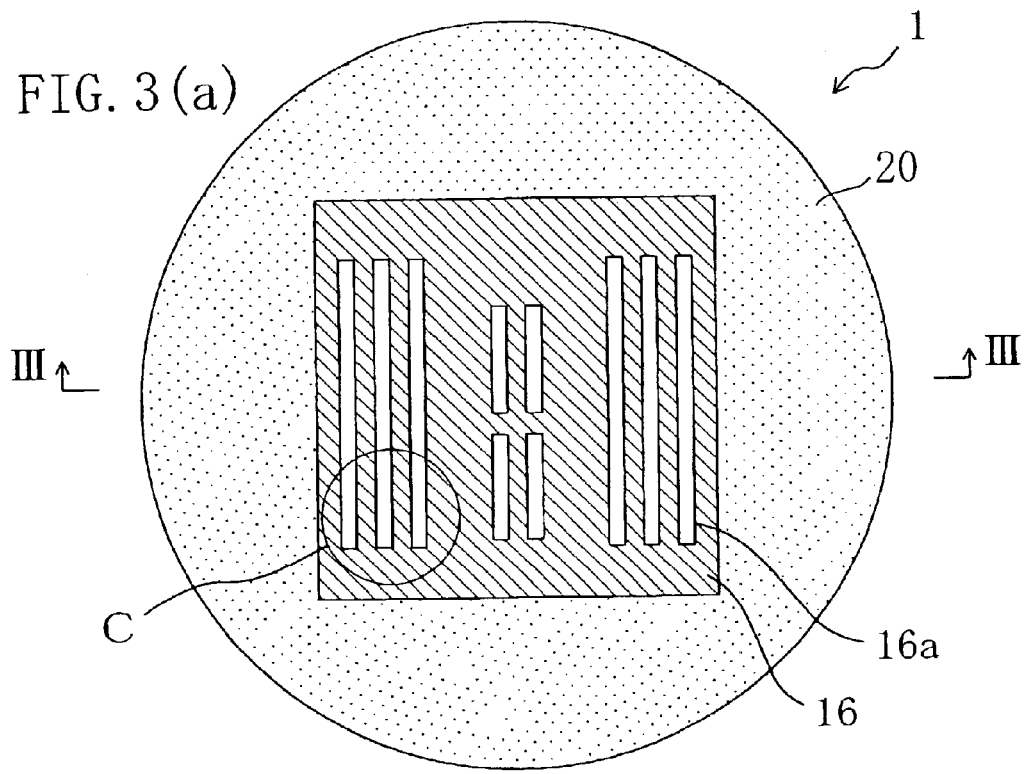
FIG. 3(a) is a top view showing a configuration of the multi-layer structured exposure mask according to Embodiment 1.

In the multi-layer structured exposure mask 1 of this embodiment, the patterning openings 14a of the stencil mask 14 are aligned with the openings 16a of the heat absorption mask 16 in the horizontal direction as shown in FIG. 3(a). In the multi-layer structured exposure mask 1 of this embodiment of the EB exposure apparatus 100, the frame 20 is set in such a way as to face the electron gun 31. That is, electron beams enter the large opening 20a from the direction indicated by an arrow A shown in FIG. 2.

Unlike the conventional exposure mask, the multi-layer structured exposure mask 1 of this embodiment is provided with the heat absorption mask 16. The heat absorption mask 16 has a high heat absorption rate and removes electron beams unnecessary to form a resist pattern out of electron beams irradiated onto the multi-layer structured exposure mask 1. This suppresses deformation of the stencil mask 14 due to thermal expansion and makes it possible to form more accurate resist patterns.

As shown in FIG. 3(a), the heat absorption mask 16 is provided with openings 16a of a size that will not block electron beams necessary to form resist patterns. That is, the size of the opening 16a is equal to the size of the patterning opening 14a or the size of the opening 16a is a little larger. Especially, it is preferable that the size of the opening 16a be 150% of the size of the pattering opening 14a or smaller. When the multi-layer structured exposure mask 1 of this embodiment is used for an application where not so high precision in the length direction of the patterning openings 14a is required (for example, formation of a wiring pattern, etc.), the openings 16a can be shorter than the patterning openings 14a.

In this embodiment, one heat absorption mask 16 made up of a silicon substrate coated with an SiN film or tungsten film is provided and the thickness of the heat absorption mask 16 is 2 μm and the width of the opening 16a is 60 nm. The thickness of the stencil mask 14 is 0.5 μm and the width of the patterning opening 14a is 50 nm. That is, the aspect ratio of the patterning opening 14a is 10.

The width and length of the opening 16a of the heat absorption mask 16 are a little larger than the width and length of the patterning opening 14a of the stencil mask 14 and the heat absorption mask 16 is aligned with stencil mask 14 so that the heat absorption mask 16 does not block the patterning opening 14a of the stencil mask 14 when electron beams enter.

Figure 3B:
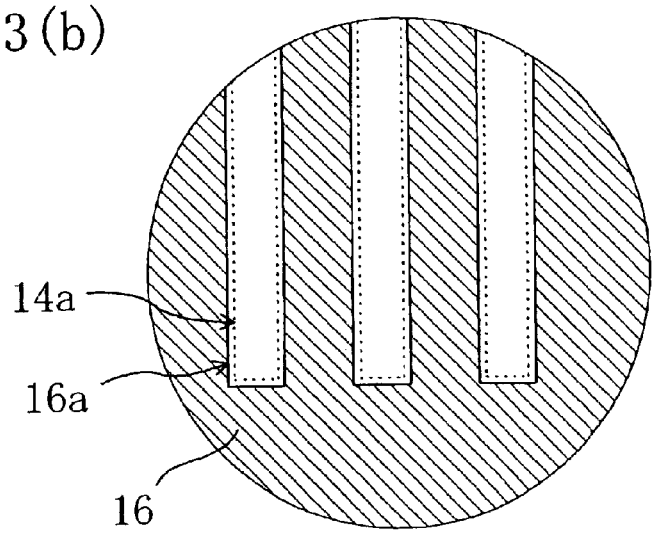
FIG. 3(b) is an enlarged view of a part encircled with a circle C shown in FIG. 3(a).

FIG. 3(b) is an enlarged view of a part encircled with a circle C shown in FIG. 3(a). As shown in FIG. 3(b), the patterning opening 14a (50 nm in width) of the stencil mask 14 indicated by broken line appears in the opening 16a (60 nm in width) of the heat absorption mask 16. That is, the stencil mask 14 is almost blocked by the heat absorption mask 16. For this reason, most of electron beams which do not contribute to the formation of a resist pattern out of electron beams irradiated onto the exposure mask are blocked by the heat absorption mask 16 and almost no electron beams are irradiated onto the stencil mask 14. Therefore, the heat absorption mask 16 generates heat, but the stencil mask 14 generates almost no heat. This suppresses or prevents deformation of the stencil mask 14.

Furthermore, as shown in FIG. 2, the heat absorption mask 16 and stencil mask 14 are separated by the hollow section 11a and do not directly touch each other. Japanese Patent Laid-Open No. 2000-188254 specification discloses a case where no hollow section 11a is provided. Unlike this case, almost none of heat generated in the heat absorption mask 16 is transmitted to the stencil mask 14 but dissipated to the outside through the silicon plate 15 and frame 20. This suppresses or prevents deformation of the silicon mask 14.

In this embodiment, the thickness of the stencil mask 14 is different from that of the heat absorption mask 16 and the thickness of the stencil mask 14 (0.5 μm) is smaller than that of the heat absorption mask 16 (2 μm). This is because it is preferable that the thickness of the stencil mask 14 be smaller when workability for forming the patterning opening 14a with high accuracy is taken into account and the thickness of the heat absorption mask 16 be greater when thermal conductivity is taken into account.

As described above, the multi-layer structured exposure mask 1 of this embodiment is provided with at least one heat absorption mask 16 to protect the stencil mask 14. This suppresses or prevents deformation of the stencil mask 14 when performing exposure of electron beams at a high acceleration voltage or with a high current, etc. using the multi-layer structured exposure mask 1 of this embodiment, and makes it possible to form resist patterns accurately matching the patterning openings 14a.

The multi-layer structured exposure mask of this embodiment displays an outstanding effect especially when a high acceleration voltage rather than a low acceleration voltage is used, or more specifically, when electron beams at 10 keV or higher or more preferably 50 keV or higher are used.

This embodiment has described the case where the multi-layer structured exposure mask 1 is used at the EB exposure apparatus, but the present invention is not limited to this. The multi-layer structured exposure mask 1 of this embodiment is ideally applicable to a charged particle beam exposure apparatus such as an ion beam exposure apparatus.

Manufacturing Method

Then, the method for manufacturing the multi-layer structured exposure mask 1 of this embodiment will be explained with reference to FIG. 4 to FIG. 6. According to this embodiment, any one of the following methods 1 to 3 can be used. FIG. 4 to FIG. 6 are process cross-sectional views showing the method for manufacturing the multi-layer structured exposure mask 1 of this embodiment and correspond to the methods 1 to 3 shown below respectively.

Method 1

First, in the process shown in FIG. 4(a), the frame 20 made of glass and having a large opening, the silicon plate 15 having a large opening as large as the large opening of the frame 20 and the heat absorption mask 16 having openings 16a formed in almost the same pattern as the pattering openings 14a provided for the stencil mask 14, which will be described later are prepared. More specifically, a heat absorption mask plate (SiN film) is formed on the under surface of the silicon plate 15 using a CVD method, etc. Then, the heat absorption mask 16 is formed by patterning the openings 16a that penetrate the heat absorption mask plate. Then, a large opening is formed in the silicon plate 15 in such a way that the openings 16a of the heat absorption mask 16 are exposed. Then, the silicon plate 15 provided with the heat absorption mask 16 obtained is pasted onto the under surface of the frame 20. At this time, alignment is performed in such a way that the large opening of the frame 20 is aligned with the large opening of the silicon plate 15 to form the large opening 20a.

Figure 4A:
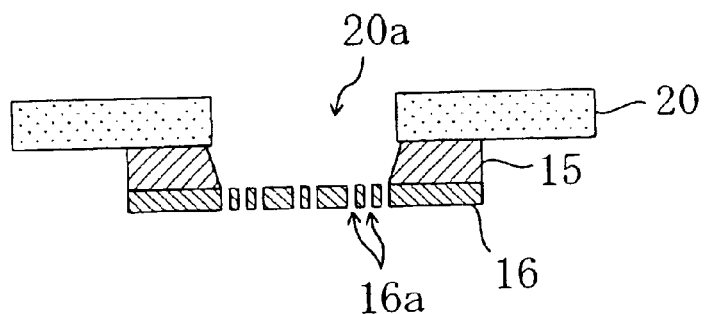
FIG. 4 is a process cross-sectional view showing a method for manufacturing the multi-layer structured exposure mask according to Embodiment 1.
Figure 4B:
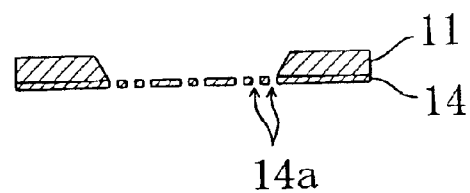

Then, in the process shown in FIG. 4(b), the silicon plate 11 provided with a large opening and the stencil mask 14 provided with the patterning openings 14a to form a resist pattern are prepared. More specifically, the silicon plate 11 on the under surface of which a silicon oxide film is formed is prepared first and a stencil mask plate (Si film) is formed on the oxide film using a CVD method, etc. Then, the stencil mask 14 is formed by forming the patterning openings 14a that penetrate the stencil mask plate. Then, a large opening is formed in the silicon plate 11 in such a way that the patterning openings 14a of the stencil mask 14 are exposed.

Figure 4C:
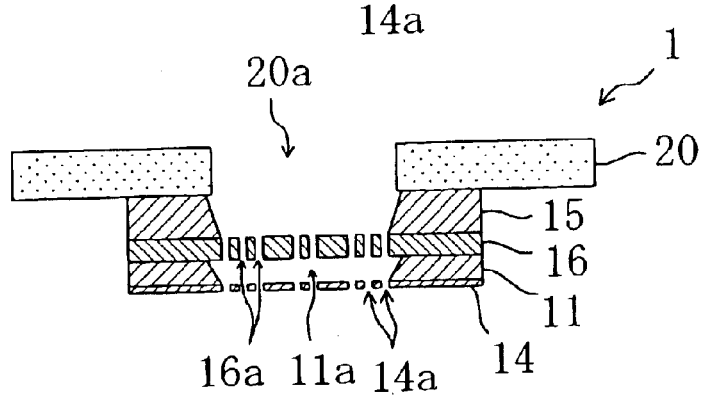

Then, in the process shown in FIG. 4(c), the under surface of the heat absorption mask 16 on the upper surface of which the frame 20 and silicon plate 15 obtained in the process shown in FIG. 4(a) are provided is pasted to the upper surface of the silicon plate 11 on the under surface of which the stencil mask 14 is provided. At this time, the openings 16a of the heat absorption mask 16 and the patterning openings 14a of the stencil mask 14 are aligned in the horizontal direction as shown in FIG. 3(a). In the present Specification, alignment in the horizontal direction refers to making the openings 16a almost match with patterning openings 14a viewed from above (viewed from the irradiation direction of electron beams).

The multi-layer structured exposure mask 1 is obtained in the processes.

This method uses either an anode junction or an adhesive as the technique for pasting the frame 20, silicon plate 15, heat absorption mask 16, silicon plate 11 and stencil mask 14 to each other.

Method 2

First, in the process shown in FIG. 5(a), the frame 20 made of glass and having a large opening, the silicon plate 15 having a large opening as large as the large opening of the frame 20 and the heat absorption mask 16 having openings 16a formed in almost the same pattern as the pattering openings 14a provided for the stencil mask 14, which will be described later are prepared. More specifically, a heat absorption mask plate (tungsten film) is formed on the under surface of the silicon plate 15 using a CVD method, etc. Then, the openings 16a that penetrate the heat absorption mask plate are patterned. Then, the heat absorption mask 16 having the openings 16a is formed by forming a large opening in the silicon plate 15 in such a way that the openings 16a of the heat absorption mask plate are exposed. Then, the silicon plate 15 provided with the heat absorption mask 16 obtained is pasted to the under surface of the frame 20. At this time, alignment is performed in such a way that the large opening of the frame 20 is aligned with the large opening of the silicon plate 15 to form the large opening 20a.

Figure 5A:
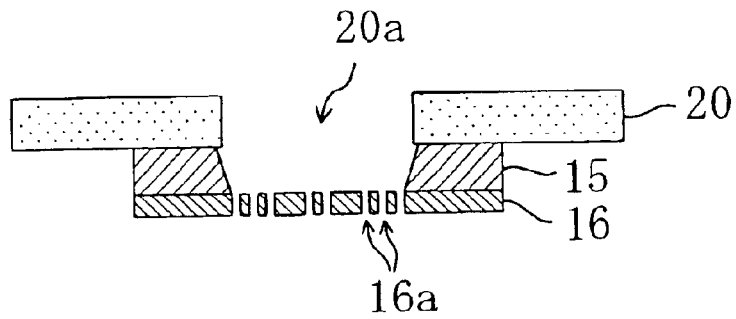
FIG. 5 is another process cross-sectional view showing the method for manufacturing the multi-layer structured exposure mask according to Embodiment 1.
Figure 5B:
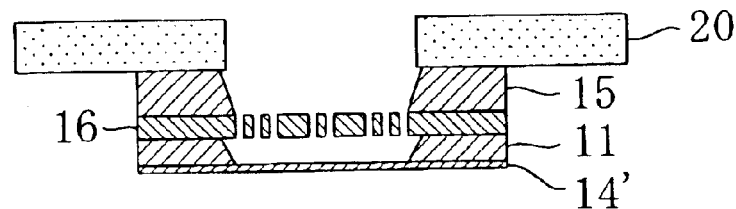

Then, in the process shown in FIG. 5(b), the silicon plate 11 provided with a large opening and the stencil mask plate 14' are prepared. More specifically, the silicon plate 11 on the under surface of which an oxide film is formed is prepared first and a stencil mask plate 14' (Si film) is formed on the oxide film using a CVD method, etc.

Then, the under surface of the heat absorption mask 16 on the upper surface of which the frame 20 and silicon plate 15 obtained in the process shown in FIG. 5(a) are provided is pasted to the upper surface of the silicon plate 11 on the under surface of which the stencil mask plate 14' is provided.

Figure 5C:
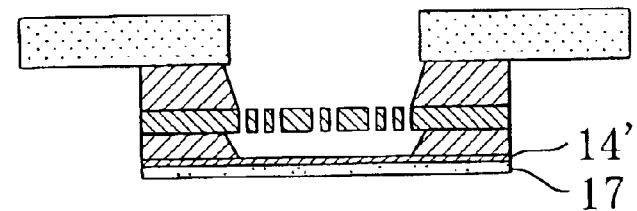

Then, in the process shown in FIG. 5(c), the resist 17 which is photosensitive to X-rays is applied to the under surface of the stencil mask plate 14'.

Figure 5D:
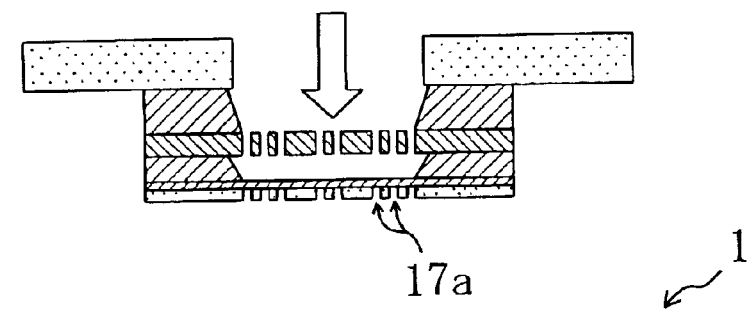

Then, in the process shown in FIG. 5(d), X-rays are irradiated from the direction shown by an arrow in the drawing and the resist 17 is subject to a photoreaction in a self-aligning way through the heat absorption mask 16. At this time, since X-rays pass through the stencil mask plate 14', the resist 17 located below the opening 16a is subject to a photoreaction. Then, the resist is developed and the resist openings 17a are formed. Here, X-rays are irradiated, but it is also possible to apply a method for patterning the resist 17 by irradiating light such as KrF excimer laser, etc. However, when light such as KrF excimer laser is irradiated, any material can be used to form the heat absorption mask 16, but the heat absorption mask 16 needs to be formed with a material that allows light of KrF excimer laser to penetrate. Of course, it is necessary to use a material photosensitive to KrF excimer laser, etc as the resist 17.

Figure 5E:
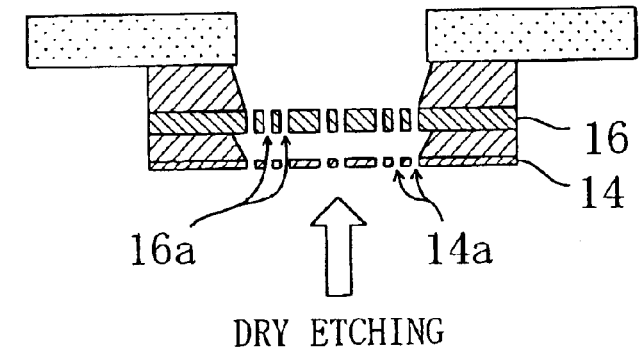

Then, in the process shown in FIG. 5(e), dry etching is applied using the resist 17 in which the resist openings 17a are formed as the mask to from the direction shown by an arrow in the drawing form the stencil mask 14 having the patterning openings 14a formed in almost the same pattern as the openings 16a.

Through the process, the multi-layer structured exposure mask 1 of this embodiment is obtained.

According to this method, the stencil mask 14 is formed based on the heat absorption mask 16, and therefore there is no need to align the openings 16a of the heat absorption mask 16 with the patterning openings 14a of the stencil mask 14. Thus, the possibility that a position difference will be generated between the openings 16a and patterning openings 14a is reduced significantly compared to the method 1. That is, this method provides the multi-layer structured exposure mask 1 in which the openings 16a match the patterning openings 14a with high accuracy.

This method uses either an anode junction or an adhesive as the technique for pasting the frame 20, silicon plate 15, heat absorption mask 16, silicon plate 11 and stencil mask 14 to each other.

Method 3

First, in the process shown in FIG. 6(a), the frame 20 made of glass and having a large opening, the silicon plate 15 having a large opening almost as large as the large opening of the frame 20 and the heat absorption mask 16 having openings 16a formed in almost the same pattern as the pattering openings 14a provided for the stencil mask 14, which will be described later are prepared. More specifically, a heat absorption mask plate (SiN film) is formed on the under surface of the silicon plate 15 using a CVD method, etc. Then, the openings 16a that penetrate the heat absorption mask plate are patterned to form the heat absorption mask 16. Then, a large opening is formed in the silicon plate 15 in such a way that the openings 16a of the heat absorption mask 16 are exposed. Then, the silicon plate 15 provided with the heat absorption mask 16 obtained is pasted to the under surface of the frame 20. At this time, alignment is performed in such a way that the large opening of the frame 20 is aligned with the large opening of the silicon plate 15 to form the large opening 20a.

Figure 6A:
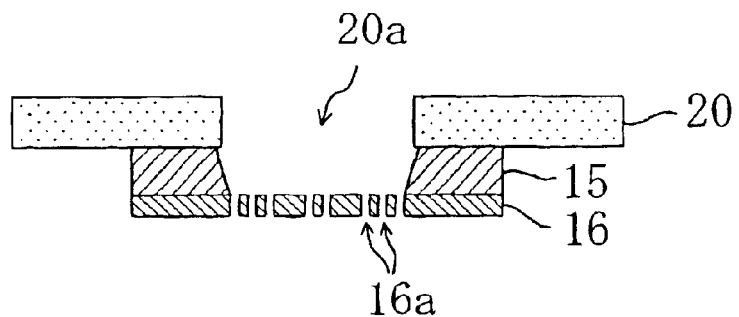
FIG. 6 is another process cross-sectional view showing the method for manufacturing the multi-layer structured exposure mask according to Embodiment 1.
Figure 6B:
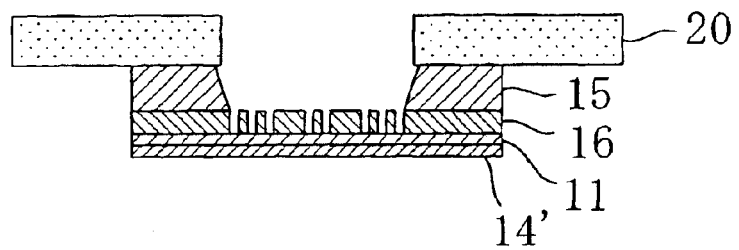

In the process shown in FIG. 6(b), the silicon plate 11 is pasted to the under surface of the heat absorption mask 16 on the upper surface of which the frame 20 and silicon plate 15 obtained in the process shown in FIG. 6(a) are provided. At this time, it is also possible to paste an SOI plate instead of the silicon plate 11.

Then, a stencil mask plate 14' (glass) is formed on the silicon oxide film of the silicon plate 11 using a CVD method, etc.

Figure 6C:
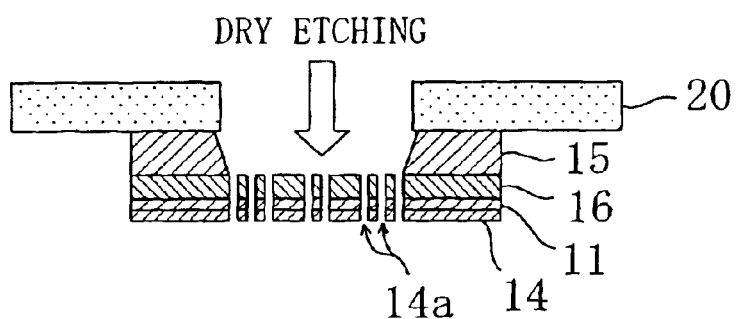

Then, in the process shown in FIG. 6(c), dry etching is performed by using the heat absorption mask 16 as the mask from the direction shown by an arrow in the drawing to form the stencil mask 14 provided with the patterning openings 14a formed in almost the same pattern as the openings 16a.

Figure 6D:
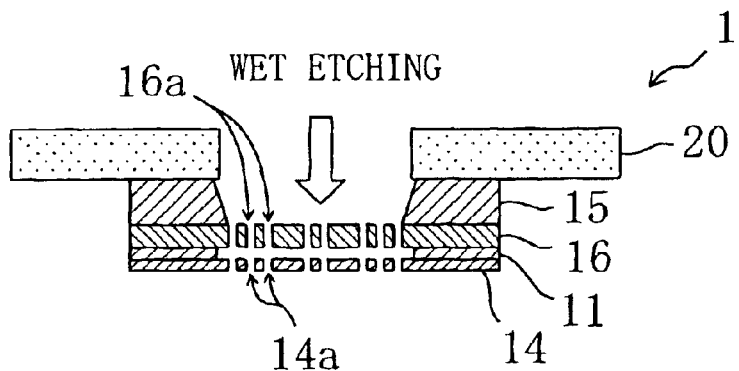

Then, in the process shown in FIG. 6(d), wet etching is performed by using the frame 20 as the mask from the direction shown by an arrow in the drawing to selectively remove the silicon plate 11. At this time, the silicon plate 11 of the area in which the openings 16a and patterning openings 14a are formed is removed and the peripheral area where no opening 16a or patterning opening 14a is formed is allowed to remain. In this way, a hollow section is formed between the heat absorption mask 16 and stencil mask 14.

In the processes, the multi-layer structured exposure mask 1 of this embodiment is obtained.

According to this method as in the case of the method 2, the stencil mask 14 is formed based on the heat absorption mask 16, and therefore there is no need to align the openings 16a of the heat absorption mask 16 with the patterning openings 14a of the stencil mask 14. Thus, the possibility that a positional difference will be generated between the openings 16a and patterning openings 14a is reduced significantly compared to the method 1. That is, this method provides the multi-layer structured exposure mask 1 in which the openings 16a match the patterning openings 14a with high accuracy.

This method uses either an anode junction or an adhesive as the technique for pasting the frame 20, silicon plate 15, heat absorption mask 16, silicon plate 11 and stencil mask 14 to each other.

Furthermore, using a component made of a material with higher etching speed than the heat absorption mask 16 and the stencil mask plate 14' instead of the silicon plate 11 makes it possible to easily form the hollow section 11a without causing almost any damage to the stencil mask 14 and heat absorption mask 16.

Or instead of the processes shown in FIG. 6(a) and FIG. 6(b), the following processes can also be performed.

First, a heat absorption mask plate (SiN film), the silicon plate 11 and the stencil mask plate 14' (glass) are formed one by one on the under surface of the silicon plate 15 by using a CVD method, etc. Then, the heat absorption mask 16 is formed by patterning the openings 16a that penetrate the heat absorption mask plate after forming a large opening in the silicon plate 15 in such a way as to expose the upper surface of the heat absorption mask plate.

Then, the silicon plate 15 provided with the heat absorption mask 16 obtained is pasted to the under surface of the frame 20 having a large opening. At this time, alignment is performed in such a way that the large opening of the frame 20 is aligned with the large opening of the silicon plate 15 to form the large opening 20a.

Modification Example

This embodiment has used a mask made up of a silicon (Si) substrate as the stencil mask 14, but the present invention is not limited to this and it is also possible to use a mask formed of a film selected from among glass, silicon nitride (SiN), silicon carbide (SiC), diamond, diamond-like, etc.

Furthermore, it is preferable that the heat absorption mask 16 be made of a material having higher thermal conductivity than the stencil mask 14. This is because using such a material makes it possible to allow the heat absorption mask to absorb heat efficiently. This embodiment has used a mask made up of a silicon nitride (SiN) film as the heat absorption mask 16, but the present invention is not limited to this and it is also possible to use a mask formed of a film selected from among silicon (Si) or silicon carbide (SiC), diamond, diamond-like, tungsten (W) and molybdenum.

By the way, the material of the stencil mask 14 is different from that of the heat absorption mask 16, but the same material can also be used. For example, it is also possible to use both masks formed of silicon substrates.

One heat absorption mask 16 is used in this embodiment, but it is also possible to change the material of the mask, thickness and the number of masks according to the acceleration voltage of electron beams. For example, the heat absorption mask 16 can be formed of a silicon substrate coated with a diamond film with high thermal conductivity and only one mask can be used. The mask can also be formed of a silicon substrate coated with a silicon nitride film with smaller thermal conductivity than diamond and three masks can be used.

This embodiment uses a frame made of glass as the frame 20, but the frame can also be made of SiC and metal, etc.

It is also possible to provide a poly Si thin film (for example, poly silicon, $SiO_2$, BPSG (boron doped phosphorus silicate glass), etc.) instead of the silicon plates 11 and 15. Or a sapphire substrate can also be used instead of the silicon plates 11 and 15.

Embodiment 2

Configuration of Multi-Layer Structured Exposure Mask

Figure 7:
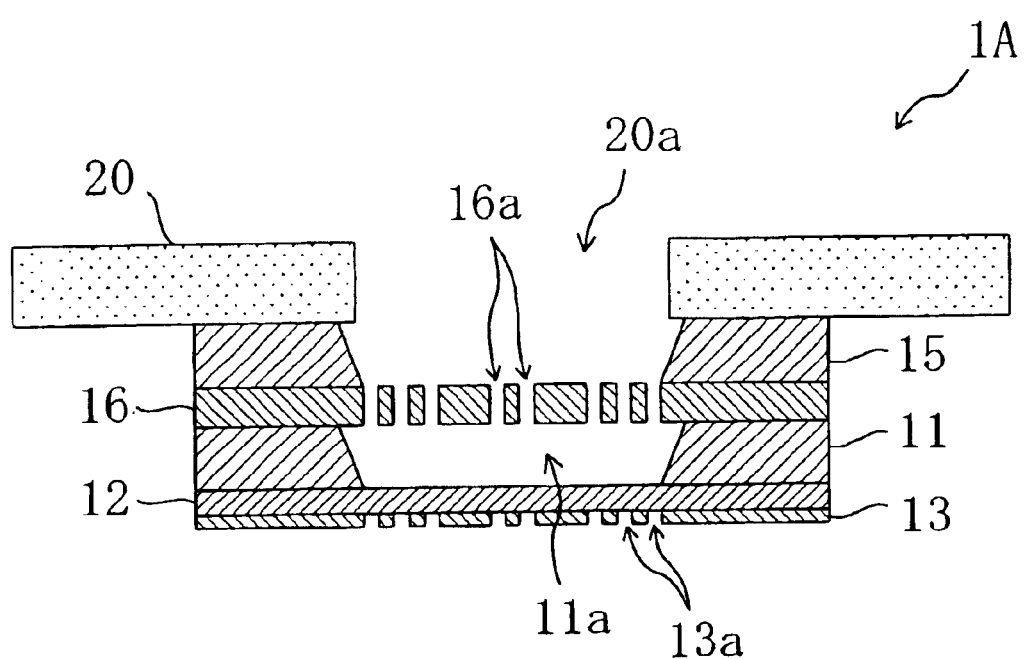
FIG. 7 is a cross-sectional view showing a configuration of a multi-layer structured exposure mask according to Embodiment 2.

This embodiment will be explained with reference to FIG. 7. FIG. 7 is a cross-sectional view showing a configuration of a multi-layer structured exposure mask according to this embodiment. The multi-layer structured exposure mask is used for an X-ray exposure apparatus.

As shown in FIG. 7, the multi-layer structured exposure mask 1A of this embodiment is provided with a frame 20 made of glass, a silicon plate 15 provided on the under surface of the frame 20, a heat absorption mask 16 provided on the under surface of the silicon plate 15, a silicon plate 11 provided on the under surface of the heat absorption mask 16, a membrane 12 provided on the under surface of the silicon plate 11 and an X-ray shielding metal film 13 provided on the under surface of the membrane 12.

The membrane 12 is provided to support the X-ray shielding metal film 13 and formed of a material (SiC, diamond, etc.) that allows X-rays to penetrate.

The X-ray shielding metal film 13 is bonded with the membrane 12. In this embodiment, the X-ray shielding metal film 13 is formed of tungsten (W) and provided with a slit-shaped patterning opening 13a to form a resist pattern.

The heat absorption mask 16 is formed of a silicon substrate coated with an SiN film and provided with openings 16a formed in almost the same pattern as the patterning openings 13a of the X-ray shielding metal film 13. The openings 16a are formed in such a size as to prevent X-rays necessary to form resist patterns from being blocked. That is, the size of the openings 16a is the same as the size of the patterning openings 13a or the size of the openings 16a is a little larger.

Furthermore, the multi-layer structured exposure mask 1A of this embodiment is provided with a large opening 20a that penetrates the frame 20 and silicon plate 15 and exposes the area of the upper surface of the heat absorption mask 16 in which the openings 16a are formed.

The multi-layer structured exposure mask 1A of this embodiment is further provided with a hollow section 11a that penetrates the silicon plate 11 and exposes an area on the under surface of the heat absorption mask 16 in which the openings 16a are formed and the upper surface of the membrane 12 in the area in which the patterning openings 13a of the X-ray shielding metal film 13 are formed.

In the multi-layer structured exposure mask 1A of this embodiment, the patterning openings 13a of the X-ray shielding metal film 13 and the openings 16a of the heat absorption mask 16 are aligned in the horizontal direction as shown in FIG. 3(a).

The multi-layer structured exposure mask 1A of this embodiment is set with the frame 20 facing the X-ray source side of the X-ray exposure apparatus. Therefore, X-rays incident upon the large opening 20a of the multi-layer structured exposure mask 1A pass through the openings 16a and then pass through the membrane 12 and patterning openings 13a.

As is apparent from the explanations, the multi-layer structured exposure mask 1A of this embodiment has almost the same structure as that of the multi-layer structured exposure mask 1 of Embodiment 1 and the components thereof are the same as those of Embodiment 1. However, this embodiment is different from Embodiment 1 in that the membrane 12 and X-ray shielding metal film 13 are provided instead of the stencil mask 14 of the multi-layer structured exposure mask 1 of Embodiment 1.

Unlike the conventional exposure mask, the multi-layer structured exposure mask 1A of this embodiment is provided with the heat absorption mask 16. The heat absorption mask 16 has a high heat absorption rate and removes X-rays unnecessary to form a resist pattern out of X-rays irradiated onto the multi-layer structured exposure mask 1.

As in the case of Embodiment 1, the heat absorption mask 16 is provided with the openings 16a in such a size as to prevent X-rays necessary to form a resist pattern from being blocked. That is, the size of the openings 16a is equal to the size of the patterning opening 13a of the X-ray shielding metal film 13 or the size of the openings 16a of the heat absorption mask 16 is larger. The size of the openings 16a is preferably 150% of the size of the patterning openings 13a or less. Furthermore, when the multi-layer structured exposure mask 1A of this embodiment is used for applications where not so high accuracy in the length direction of the patterning openings 13a is required (for example, formation of a wiring pattern), the openings 16a can be shorter than the patterning openings 13a.

In this embodiment, one heat absorption mask 16 formed of a silicon substrate which is coated with an SiN film is provided, the heat absorption mask 16 has a thickness of 2 μm and the opening 16a has a width of 60 nm. The X-ray shielding metal film 13 has a thickness of 0.5 μm and the patterning opening 13a has a width of 50 nm. That is, the aspect ratio of the patterning opening 13a is 10.

The opening 16a of the heat absorption mask 16 is a little larger than the patterning opening 13a of the X-ray shielding metal film 13 and the heat absorption mask 16 and X-ray shielding metal film 13 are aligned in such a way as to prevent the heat absorption mask 16 from blocking the patterning openings 13a of the X-ray shielding metal film 13 when X-rays enter.

For this reason, most of X-rays that do not contribute to formation of the resist pattern out of X-rays irradiated onto the multi-layer structured exposure mask 1A of this embodiment are blocked by the heat absorption mask 16, which reduces X-rays irradiated onto the X-ray shielding metal film 13. Therefore, the heat absorption mask 16 generates heat, while heat generation of the X-ray shielding metal film 13 is suppressed. This suppresses or prevents deformation of the X-ray shielding metal film 13.

Furthermore, the heat absorption mask 16 is separated from the membrane 12 by the hollow section 11a and the two do not contact each other. Because of this, the heat generated in the heat absorption mask 16 is mostly not transmitted to the X-ray shielding metal film 13 but dissipated to the outside through the silicon plate 15 and frame 20. This suppresses or prevents deformation of the X-ray shielding metal film 13.

As described above, the multi-layer structured exposure mask 1A of this embodiment is provided with the heat absorption mask 16 to protect the X-ray shielding metal film 13. Thus, using the multi-layer structured exposure mask 1A of this embodiment suppresses or prevents deformation of the X-ray shielding metal film 13 even when carrying out exposure to X-rays with high energy (e.g., SOR-X-rays (synchrotron orbital radiation X-ray)), making it possible to form a resist pattern exactly matching the patterning openings 13a.

The multi-layer structured exposure mask 1A of this embodiment also displays an outstanding effect using plasma X-rays which have high energy, discharge type X-rays, etc. in addition to SOR-X-rays.

Especially when SOR-X-rays are used, the SOR-X-ray beam emitted from the X-ray source has a rectangular shape. These SOR-X-rays are vibrated above and below the silicon wafer using mirrors to secure a drawing area. For this reason, the amount of X-rays irradiated onto the exposure mask is considerable. Thus, with the exposure mask onto which rectangular X-ray beams are irradiated, there is concern about pattern displacement due to a temperature rise. However, using the multi-layer structured exposure mask 1A of this embodiment suppresses heat generation of the X-ray shielding metal film 13 and can thereby prevent deformation of the patterning openings 13a.

Manufacturing Method

Then, the method for manufacturing the multi-layer structured exposure mask 1A of this embodiment will be explained with reference to FIG. 8 and FIG. 9. Any of the following method 1A and method 2A can be used in this embodiment. FIG. 8 and FIG. 9 are process cross-sectional views showing the method for manufacturing the multi-layer structured exposure mask 1A of this embodiment and correspond to the method 1A and method 2A shown below respectively.

Method 1A

First, in the process shown in FIG. 8(a), the frame 20 made of glass and having a large opening, the silicon plate 15 having a large opening almost as large as the large opening of the frame 20 and the heat absorption mask 16 having openings 16a formed in almost the same pattern as the pattering openings 13a provided for the X-ray shielding metal film 13, which will be described later are prepared. More specifically, a heat absorption mask plate (SiN film) is formed on the under surface of the silicon plate 15 using a CVD method, etc. Then, the heat absorption mask 16 is formed by patterning the openings 16a that penetrate the heat absorption mask plate. Then, a large opening is formed in the silicon plate 15 in such a way that the openings 16a of the heat absorption mask 16 are exposed. Then, the silicon plate 15 provided with the heat absorption mask 16 obtained is pasted to the under surface of the frame 20. At this time, alignment is performed by aligning the large opening of the frame 20 with the large opening of the silicon plate 15 to form the large opening 20a.

Figure 8A:
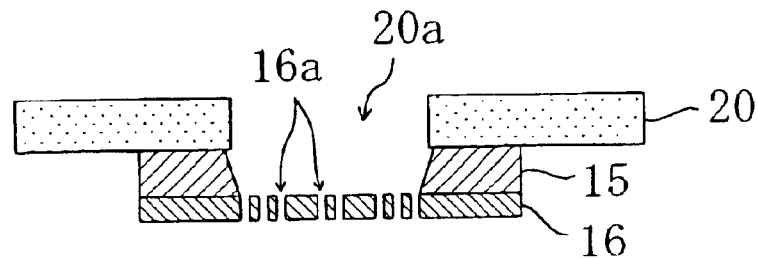
FIG. 8 is a process cross-sectional view showing a method for manufacturing the multi-layer structured exposure mask according to Embodiment 2.
Figure 8B:
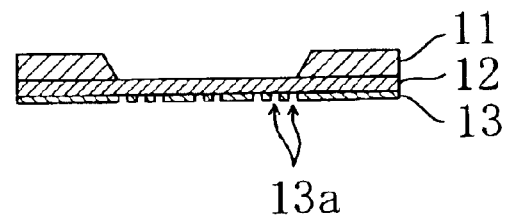

Then, in the process shown in FIG. 8(b), the silicon plate 11 provided with a large opening, the membrane 12 and the X-ray shielding metal film 13 provided with the patterning openings 13a to form a resist pattern are prepared. More specifically, the membrane 12 and X-ray shielding metal plate are formed on the under surface of the silicon plate 11 one by one using a CVD method, etc. Then, the X-ray shielding metal film 13 is formed by forming the patterning openings 13a that penetrate the X-ray shielding metal plate. Then, a large opening is formed in the silicon plate 11 in such a way that the upper surface of the membrane 12 in the area in which the patterning openings 13a of the X-ray shielding metal film 13 are formed is exposed.

Figure 8C:
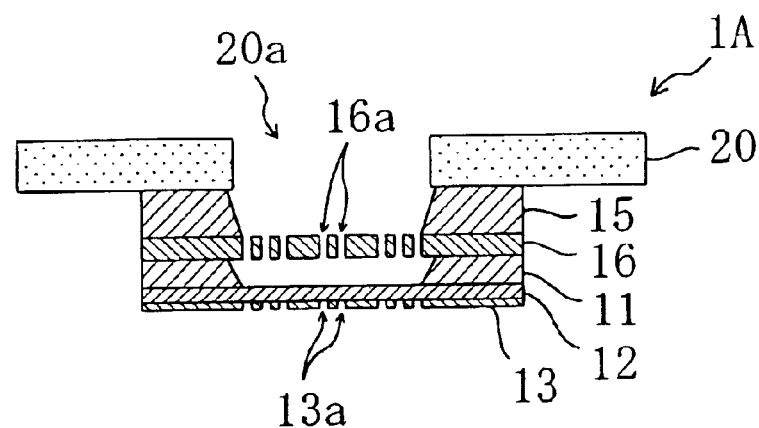

Then, in the process shown in FIG. 8(c), the under surface of the heat absorption mask 16 on the upper surface of which the frame 20 and silicon plate 15 obtained in the process shown in FIG. 8(a) are provided is pasted to the upper surface of the silicon plate 11 on the under surface of which the X-ray shielding metal film 13 is provided. At this time, the openings 16a of the heat absorption mask 16 and the patterning openings 13a of the X-ray shielding metal film 13 are aligned in the horizontal direction.

In the processes, the multi-layer structured exposure mask 1A of this embodiment is obtained.

This method uses either an anode junction or an adhesive as the technique for pasting the frame 20, silicon plate 15, heat absorption mask 16, silicon plate 11, membrane 12 and X-ray shielding metal film 13 to each other.

Method 2A

Figure 9A:
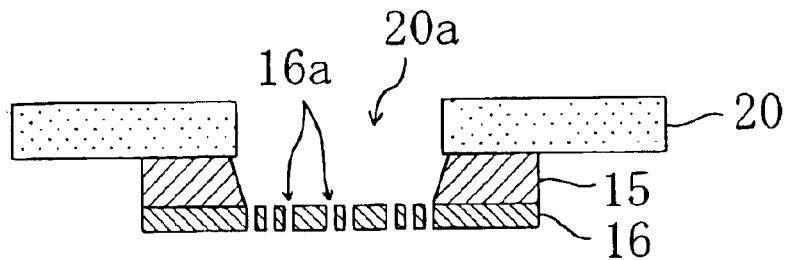
FIG. 9 is another process cross-sectional view showing the method for manufacturing the multi-layer structured exposure mask according to Embodiment 2.

First, in the process shown in FIG. 9(a), the frame 20 made of glass and having a large opening, the silicon plate 15 having a large opening as large as the large opening of the frame 20 and the heat absorption mask 16 having openings 16a formed in almost the same pattern as the pattering openings 13a provided for the X-ray shielding metal film 13, which will be described later, are prepared. More specifically, a heat absorption mask plate (SiN film) is formed on the under surface of the silicon plate 15 using a CVD method, etc. Then, the heat absorption mask 16 is formed by patterning the openings 16a that penetrate the heat absorption mask plate. Then, a large opening is formed in the silicon plate 15 so that the openings 16a of the heat absorption mask 16 are exposed. Then, the silicon plate 15 provided with the heat absorption mask 16 obtained is pasted to the under surface of the frame 20. At this time, alignment is performed in such a way that the large opening of the frame 20 is aligned with the large opening of the silicon plate 15 to form the large opening 20a.

Figure 9B:
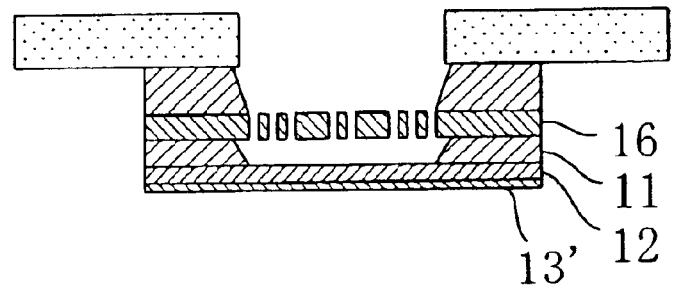

Then, in the process shown in FIG. 9(b), the silicon plate 11 provided with a large opening, the membrane 12 and the X-ray shielding metal plate 13' are prepared. More specifically, the membrane 12 and X-ray shielding metal plate 13' are formed on the under surface of the silicon plate 11 one by one using a CVD method, etc. Then, a large opening is formed in the silicon plate 11 so that the upper surface of the membrane 12 is exposed. Then, the under surface of the heat absorption mask 16 obtained in the process shown in FIG. 9(a) on the upper surface of which the frame 20 and silicon plate 15 are provided is pasted to the upper surface of the silicon plate 11 on the under surface of which the X-ray shielding metal plate 13' is provided.

Figure 9C:
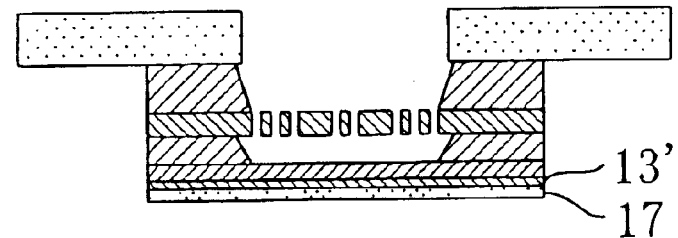

Then, in the process shown in FIG. 9(c), the resist 17 which is photosensitive to X-rays is applied to the under surface of the X-ray shielding metal plate 13'.

Figure 9D:
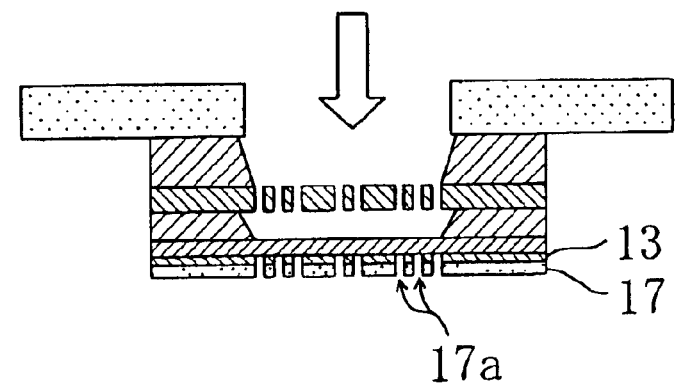

Then, in the process shown in FIG. 9(d), X-rays are irradiated from the direction shown by an arrow in the drawing and the resist 17 is subject to a photoreaction in a self-aligning way through the heat absorption mask 16. At this time, X-rays with intensity capable of penetrating the X-ray shielding metal plate 13' are irradiated and the resist 17 located below the openings 16a is subject to a photoreaction. X-rays used in this process have much higher intensity than X-rays used in a normal X-ray exposure apparatus.

Then, the resist is developed to form resist openings 17a.

Then, dry etching is applied using the resist 17 in which the resist opening 17a is formed as the mask to form the X-ray shielding metal film 13 having patterning openings 13a formed in almost the same pattern as the openings 16a.

Then, by removing the resist 17, the multi-layer structured exposure mask 1A of this embodiment is obtained.

According to this method, the X-ray shielding metal film 13 is formed based on the heat absorption mask 16, and therefore there is no need to align the openings 16a of the heat absorption mask 16 and the patterning openings 13a of X-ray shielding metal film 13. This significantly reduces the possibility that there will be a positional difference between the openings 16a and patterning openings 13a compared to the method 1. That is, this method provides the multi-layer structured exposure mask 1 in which the openings 16a match the patterning openings 13a with high accuracy.

This method uses either an anode junction or an adhesive as the technique for pasting the frame 20, silicon plate 15, heat absorption mask 16, silicon plate 11, membrane 12 and X-ray shielding metal film 13 to each other.

Modification Example

This embodiment has used the X-ray shielding metal film 13 made up of a tungsten (W) substrate, but the present invention is not limited to this and it is also possible to use a X-ray shielding metal film made of a material through which X-rays are hardly transmissible such as molybdenum (Mo), vanadium (V) and tantalum (Ta).

Moreover, this embodiment uses only one heat absorption mask 16, but the material of the mask, thickness and the number of masks can be changed according to a wavelength (energy) of X-rays. For example, the heat absorption mask 16 can be formed of a silicon substrate coated with diamond with high thermal conductivity and one heat absorption mask can be used. Or three heat absorption masks can be formed of a silicon substrate coated with a silicon nitride film which has smaller thermal conductivity than diamond.

Especially, the heat absorption mask 16 is preferably made of a material with higher thermal conductivity than that of the X-ray shielding metal film 13. This is because adopting such a material allows the heat absorption mask to absorb heat efficiently. This embodiment uses the heat absorption mask 16 formed of a silicon substrate coated with a silicon nitride (SiN) film, but the present invention is not limited to this and it is also possible to use a heat absorption mask formed of a silicon substrate coated with a film selected from silicon carbide (SiC), diamond, diamond-like, tungsten (W) and molybdenum (Mo).

By the way, this embodiment uses the X-ray shielding metal film 13 and the heat absorption mask 16 made of different materials, but the same material can also be used. For example, both can be formed of a tungsten film.

Furthermore, this embodiment uses the frame 20 made of glass, but can also use the frame 20 made of SiC and metal, etc.

Instead of the silicon plates 11 and 15, it is also possible to provide a thin film such as poly silicon, $SiO_2$, BPSG (boron doped phosphorus silicate glass), etc. Or it is possible to use a sapphire plate instead of the silicon plates 11 and 15.

Embodiment 3

Configuration of Multi-Layer Structured Exposure Mask

Figure 10:
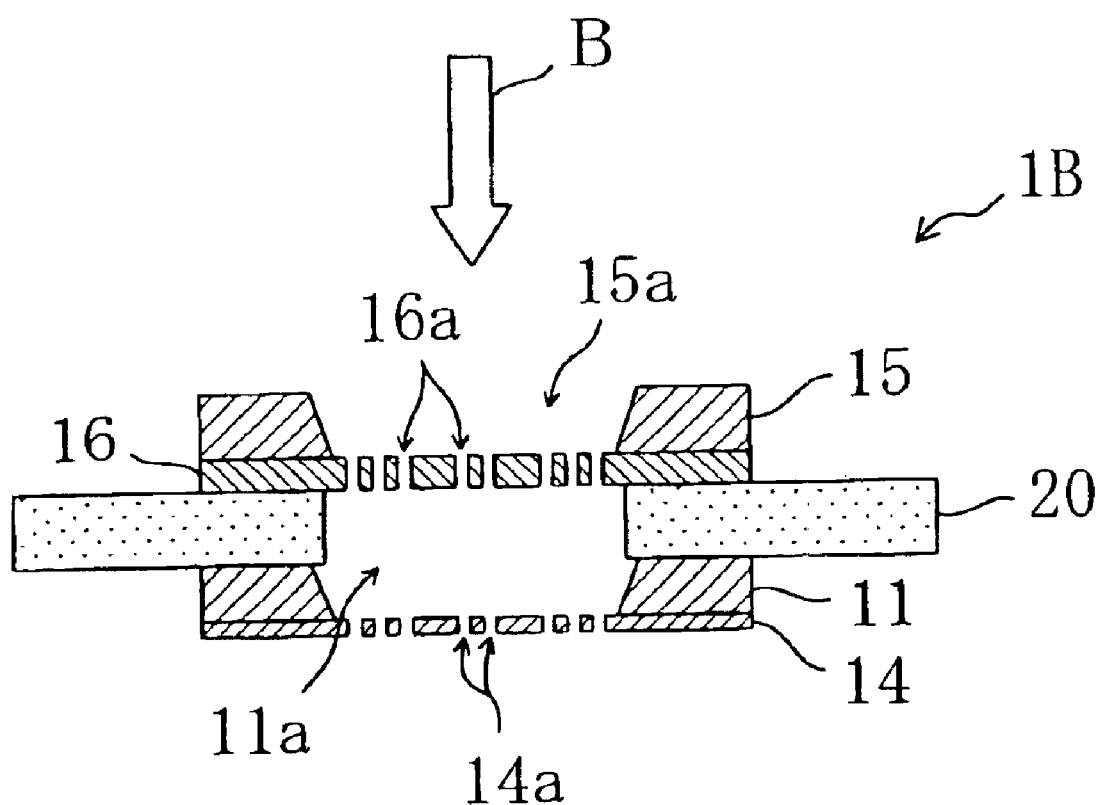
FIG. 10 is a cross-sectional view showing a configuration of a multi-layer structured exposure mask according to Embodiment 3.

This embodiment will be explained with reference to FIG. 10. FIG. 10 is a cross-sectional view showing a configuration of a multi-layer structured exposure mask according to this embodiment. The multi-layer structured exposure mask in this embodiment is used for an electron beam exposure apparatus.

As shown in FIG. 10, the multi-layer structured exposure mask 1B of this embodiment is provided with a frame 20 made of glass, a silicon plate 11 provided on the under surface of the frame 20, a stencil mask 14 provided on the under surface of the silicon plate 11, a heat absorption mask 16 provided on the upper surface of the frame 20 and a silicon plate 15 provided on the upper surface of the heat absorption mask 16.

The stencil mask 14 is formed of a silicon substrate and provided with slit-shaped patterning openings 14a to form a resist pattern.

The heat absorption mask 16 is formed of a silicon substrate coated with an SiN film and provided with openings 16a formed in almost the same pattern as the patterning openings 14a of the stencil mask 14. The openings 16a are formed in such a size as to prevent electron beams necessary to form a resist pattern from being blocked. That is, the size of the opening 16a is the same as the size of the patterning opening 14a or the size of the opening 16a is a little larger.

Furthermore, the multi-layer structured exposure mask 1B of this embodiment is provided with the hollow section 11a, which penetrates the frame 20 and silicon plate 11 and exposes an area of the under surface of the heat absorption mask 16 in which the openings 16a are formed and an area of the upper surface of the stencil mask 14 in which the patterning openings 14a are formed.

In the multi-layer structured exposure mask 1B of this embodiment, the patterning opening 14a of the stencil mask 14 and the opening 16a of the heat absorption mask 16 are aligned in the horizontal direction as shown in FIG. 3(a).

The multi-layer structured exposure mask 1B of this embodiment is set with the frame 20 facing the electron gun 31 side of the EB exposure apparatus 100 as in the case of the multi-layer structured exposure mask 1 of Embodiment 1 and electron beams are irradiated in the direction indicated by an arrow B in FIG. 10. At this time, electron beams that have passed through the openings 16a pass through the patterning openings 13a.

As is apparent from the explanations, the multi-layer structured exposure mask 1B of this embodiment has almost the same structure as that of the multi-layer structured exposure mask 1 of Embodiment 1 and the components thereof are the same as those of Embodiment 1. However, this embodiment is different from the multi-layer structured exposure mask 1 of Embodiment 1 only in the pasting order of the frame 20 and silicon plate 15 (heat absorption mask 16).

As in the case of the multi-layer structured exposure mask 1 of Embodiment 1, the multi-layer structured exposure mask 1B of this embodiment is provided with the heat absorption mask 16. This suppresses deformation of the stencil mask 14 due to thermal expansion just like the multi-layer structured exposure mask 1 of Embodiment 1, allowing more accurate formation of the resist pattern.

Furthermore, the heat absorption mask 16 and stencil mask 14 are separated by the hollow section 11a and do not directly touch each other. For this reason, almost no heat generated in the heat absorption mask 16 is transmitted to the stencil mask 14 but dissipated to the outside through the silicon plate 15 and frame 20. This suppresses or prevents deformation of the stencil mask 14.

Figure 11:
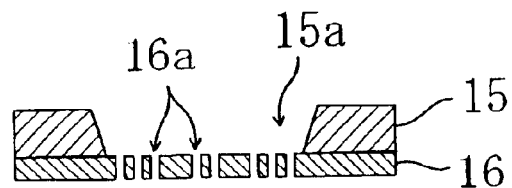
FIG. 11 is another process cross-sectional view showing the method for manufacturing the multi-layer structured exposure mask according to Embodiment 3.
Figure 11:
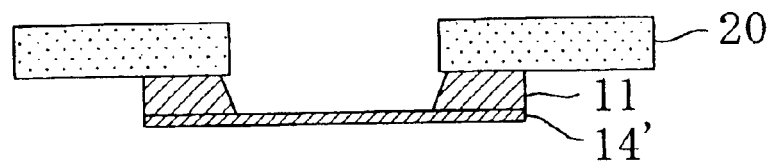
Figure 11:
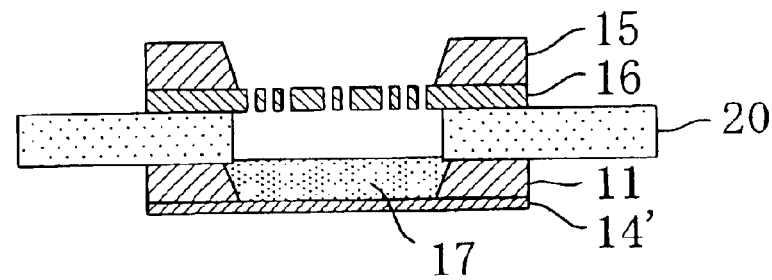
Figure 11:
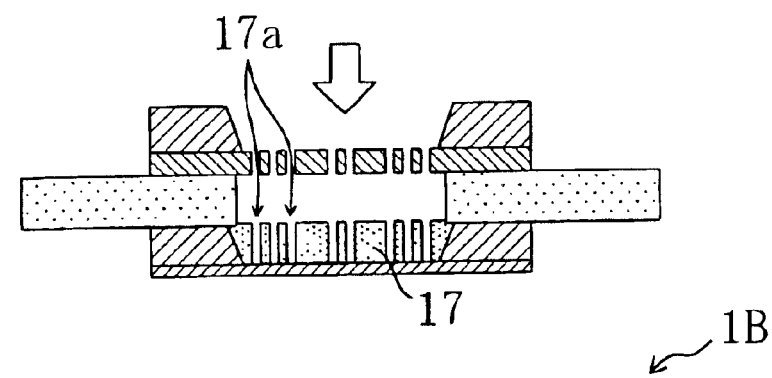
Figure 11:
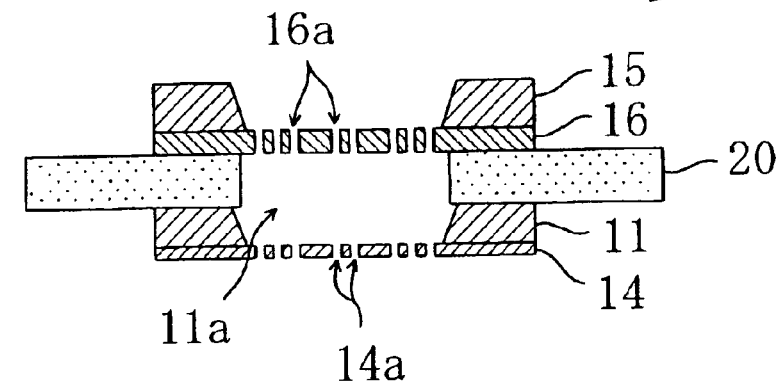

It is also possible to apply the modification example described in Embodiment 1 to the multi-layer structured exposure mask 1B of this embodiment and the effect obtained by that modification can also be obtained likewise.
Manufacturing Method Then, the method for manufacturing the multi-layer structured exposure mask 1B of this embodiment will be explained with reference to FIG. 11. FIG. 11 is a process cross-sectional view showing the method for manufacturing the multi-layer structured exposure mask 1 according to this embodiment.

First, in the process shown in FIG. 11(a), the silicon plate 15 having a large opening 15a, the heat absorption mask 16 having openings 16a formed in almost the same pattern as the pattering openings 14a provided for the stencil mask 14, which will be described later, are prepared. More specifically, a heat absorption mask plate (SiN film) is formed on the under surface of the silicon plate 15 using a CVD method, etc. Then, the heat absorption mask 16 is formed by patterning the openings 16a that penetrate the heat absorption mask plate. Then, a large opening is formed in the silicon plate 15 in such a way that the openings 16a of the heat absorption mask 16 are exposed.

Then, in the process shown in FIG. 11(b), the frame 20 made of glass and having a large opening, the silicon plate 11 provided with a large opening almost as large as the large opening of the frame 20 and the stencil mask plate 14' are prepared. More specifically, the silicon plate 11 with a silicon oxide film formed on the under surface is prepared first and a stencil mask plate 14' (Si film) is formed on the silicon oxide film using a CVD method, etc. Then, a large opening is formed in the silicon plate 11 in such a way that the upper surface of the stencil mask plate 14' is exposed. Then, the silicon plate 11 is pasted to the under surface of the frame 20. At this time, alignment is performed in such a way that the large opening of the frame 20 is aligned with the large opening of the silicon plate 11.

Then, in the process shown in FIG. 11(c), a resist 17 is formed on the upper surface of the stencil mask plate 14' exposed in the large opening of the silicon plate 11.

Then, the under surface of the heat absorption mask 16 on the upper surface of which the silicon plate 15 is provided is pasted to the upper surface of the silicon plate 11 the under surface of which the frame 20 and stencil mask plate 14' are provided. At this time, alignment is performed in such a way that the large opening of the frame 20 faces the area of the under surface of the heat absorption mask 16 in which the openings 16a are formed.

By the way, after pasting the under surface of the heat absorption mask 16 on the upper surface of which the silicon plate 15 is provided to the upper surface of the silicon plate 11 on the under surface of which the frame 20 and stencil mask plate 14' are provided in this process, it is also possible to form the resist 17 on the upper surface of the stencil mask plate 14'.

Then, in the process shown in FIG. 11(d), X-rays are irradiated from the direction shown by an arrow in the drawing and the resist 17 is subject to a photoreaction in a self-aligning way through the heat absorption mask 16. Then, the resist is developed to form resist openings 17a.

Then, dry etching is applied using the resist 17 in which the resist openings 17a are formed as the mask from the direction indicated by the arrow in the drawing to form a stencil mask 14 having patterning openings 14a formed in almost the same pattern as the openings 16a.

In the processes, the multi-layer structured exposure mask 1 of this embodiment is obtained.

According to this method, the stencil mask 14 is formed based on the heat absorption mask 16, and therefore there is no need to align the openings 16a of the heat absorption mask 16 and the patterning openings 14a of the stencil mask 14. This significantly reduces the possibility that there will be a positional difference between the openings 16a and patterning openings 14a. That is, this method provides the multi-layer structured exposure mask 1B in which the opening 16a matches the patterning opening 14a with high accuracy.

This method uses either an anode junction or an adhesive as the technique for pasting the frame 20, silicon plate 15, heat absorption mask 16, silicon plate 11 and stencil mask 14 to each other.

Furthermore, the multi-layer structured exposure mask 1B of this embodiment is different from the multi-layer structured exposure mask 1 of Embodiment 1 only in the pasting order of the frame 20, silicon plate 15 and heat absorption mask 16. Therefore, in the method 1 described in Embodiment 1, by changing the pasting order of the frame 20, silicon plate 15 and heat absorption mask 16, it is possible to prepare the multi-layer structured exposure mask 1B of this embodiment.

Embodiment 4
Configuration of Multi-Layer Structured Exposure Mask

Figure 12:
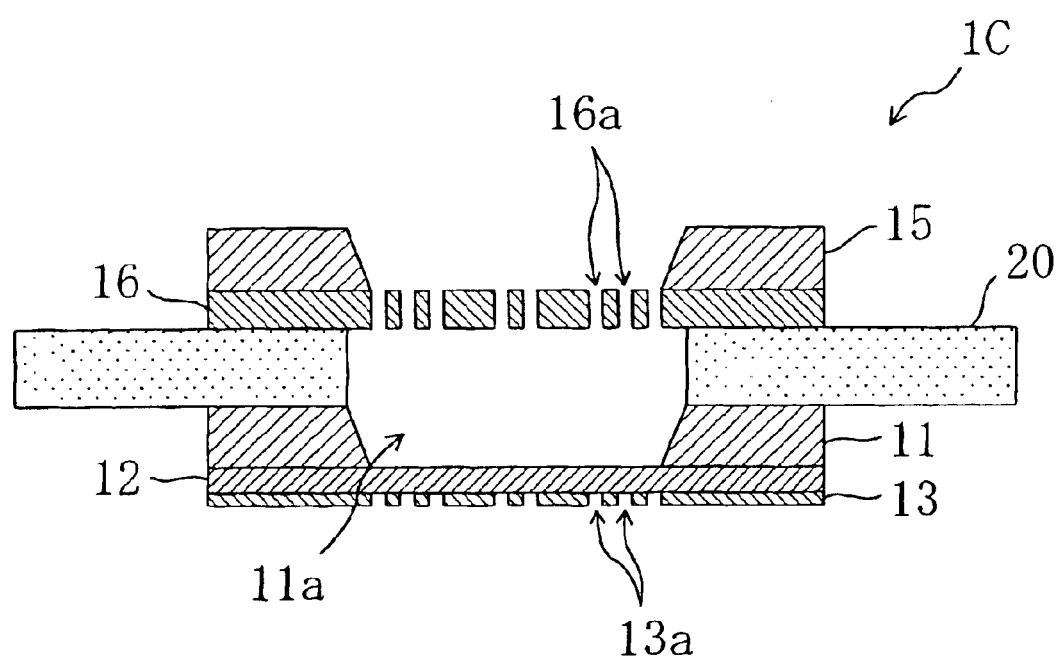
FIG. 12 is a cross-sectional view showing a configuration of a multi-layer structured exposure mask according to Embodiment 4.

This embodiment will be explained with reference to FIG. 12. FIG. 12 is a cross-sectional view showing a configuration of a multi-layer structured exposure mask according to this embodiment. The multi-layer structured exposure mask is used for an X-ray exposure apparatus.

As shown in FIG. 12, the multi-layer structured exposure mask 1C of this embodiment is provided with a frame 20 made of glass, a silicon plate 11 provided on the under surface of the frame 20, a membrane 12 provided on the under surface of the silicon plate 11, an X-ray shielding metal film 13 provided on the under surface of the membrane 12, a heat absorption mask 16 provided on the upper surface of the frame 20 and a silicon plate 15 provided on the upper surface of the heat absorption mask 16.

The membrane 12 is provided to hold the X-ray shielding metal film 13 and formed of a material allowing X-rays to penetrate (SiC, diamond, etc.).

The X-ray shielding metal film 13 is bonded with the membrane 12. In this embodiment, the X-ray shielding metal film 13 is formed of tungsten and provided with a slit-shaped patterning opening 13a to form a resist pattern.

The heat absorption mask 16 is formed of a silicon substrate coated with an SiN film and provided with openings 16a formed in almost the same pattern as the patterning openings 13a of the X-ray shielding metal film 13. The openings 16a are formed in such a size as to prevent X-rays necessary to form resist patterns from being blocked. That is, the size of the opening 16a is the same as the size of the patterning opening 13a or the size of the opening 16a is a little larger.

Furthermore, the multi-layer structured exposure mask 1C of this embodiment is provided with a hollow section 11a, which penetrates the frame 20 and silicon plate 11 and exposes an area of the heat absorption mask 16 in which the openings 16a are formed and the upper surface of the membrane 12 of the area in which the patterning openings 13a of the X-ray shielding metal film 13 are formed.

In the multi-layer structured exposure mask 1C of this embodiment, the patterning openings 13a of the X-ray shielding metal film 13 and the openings 16a of the heat absorption mask 16 are aligned in the horizontal direction as shown in FIG. 3(a).

The multi-layer structured exposure mask 1C of this embodiment is set with the silicon plate 15 facing the X-ray source side of the X-ray exposure apparatus. Therefore, X-rays that have passed through the openings 16a pass through the membrane 12 and then pass through the patterning openings 13a.

As is apparent from the explanations, the multi-layer structured exposure mask 1C of this embodiment has almost the same structure as that of the multi-layer structured exposure mask 1B of Embodiment 3 and the components thereof are almost the same as those of Embodiment 1. However, this embodiment is different only in that the membrane 12 and X-ray shielding metal film 13 are provided instead of the stencil mask 14 of the multi-layer structured exposure mask 1B of Embodiment 3.

As in the case of the multi-layer structured exposure mask 1A of Embodiment 2, the multi-layer structured exposure mask 1C of this embodiment is provided with the heat absorption mask 16. This suppresses deformation of the X-ray shielding metal film 13 due to thermal expansion just like the multi-layer structured exposure mask 1A of Embodiment 2, allowing more accurate formation of resist patterns.

Furthermore, the heat absorption mask 16 and X-ray shielding metal film 13 are separated by the hollow section 11a and do not directly touch each other. For this reason, almost no heat generated in the heat absorption mask 16 is transmitted to the X-ray shielding metal film 13 but dissipated to the outside through the silicon plate 15 and frame 20. This suppresses or prevents deformation of the X-ray shielding metal film 13.

It is also possible to apply the modification example described in Embodiment 2 to the multi-layer structured exposure mask 1C of this embodiment and the effect obtained by that modification can also be obtained likewise.

Manufacturing Method

Then, the method for manufacturing the multi-layer structured exposure mask 1A of this embodiment will be explained with reference to FIG. 13 and 14. Either of the following method 1C or method 2C can be used in this embodiment. FIG. 13 and FIG. 14 are process cross-sectional views showing the method for manufacturing the multi-layer structured exposure mask 1C according to this embodiment and correspond to the method 1C and 2C respectively.

Method 1C

Figure 13A:
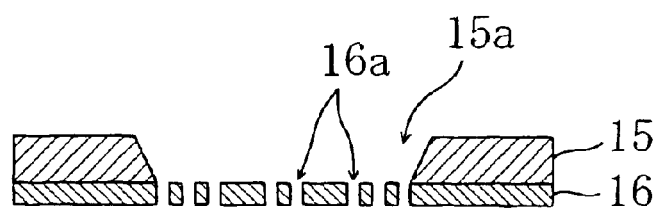
FIG. 13 is a process cross-sectional view showing the method for manufacturing the multi-layer structured exposure mask according to Embodiment 4.

First, in the process shown in FIG. 13(a), the silicon plate 15 having a large opening 15a, the heat absorption mask 16 having openings 16a formed in almost the same pattern as the pattering openings 13a provided for the X-ray shielding metal film 13, which will be described later, are prepared. More specifically, a heat absorption mask plate (SiN film) is formed on the under surface of the silicon plate 15 using a CVD method, etc. Then, the heat absorption mask 16 is formed by patterning the openings 16a that penetrate the heat absorption mask plate. Then, a large opening 15a is formed in the silicon plate 15 in such a way that the openings 16a of the heat absorption mask 16 are exposed.

Figure 13B:
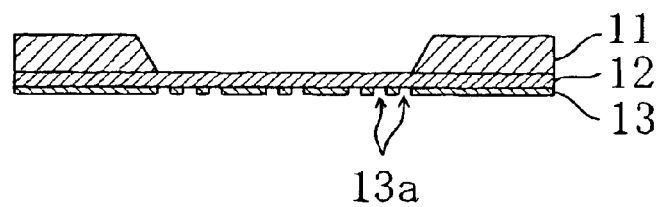

Then, in the process shown in FIG. 13(b), the silicon plate 11 having a large opening, membrane 12 and X-ray shielding metal film 13 provided with the patterning openings 13a to form a resist pattern are prepared. More specifically, the membrane 12 and X-ray shielding metal plate are formed on the under surface of the silicon plate 11 one by one using a CVD method, etc. Then, the X-ray shielding metal film 13 is formed by forming the patterning openings 13a that penetrate the X-ray shielding metal plate. Then, a large opening is formed in the silicon plate 11 in such a way as to expose the upper surface of the membrane 12 of the area in which the patterning openings 13a of the X-ray shielding metal film 13 are formed.

Figure 13C:
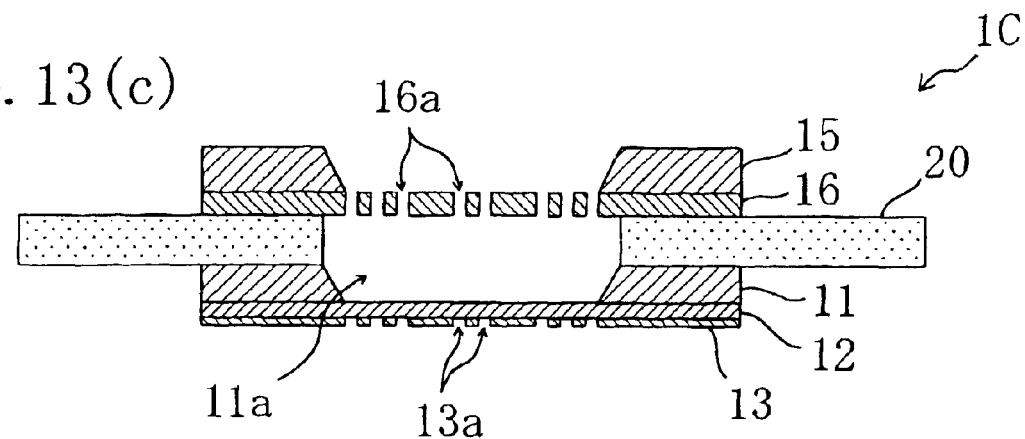

Then, in the process shown in FIG. 13(c), the frame 20 made of glass and having a large opening is prepared. Then, the upper surface of the frame 20 is passed to the under surface of the heat absorption mask 16 on the upper surface of which the silicon plate 15 is provided and which is obtained in the process shown in FIG. 3(a). Then, the under surface of the frame 20 is pasted to the upper surface of the silicon plate 11 on the under surface of which the X-ray shielding metal film 13 obtained in the process shown in FIG. 13(b) is provided. At this time, the openings 16a of the heat absorption mask 16 and the patterning openings 13a of the X-ray shielding metal film 13 are aligned in the horizontal direction.

In the processes, the multi-layer structured exposure mask 1C of this embodiment is obtained.

This method uses either an anode junction or an adhesive as the technique for pasting the frame 20, silicon plate 15, heat absorption mask 16, silicon plate 11, membrane 12 and X-ray shielding metal film 13 to each other.

Method 2C

Figure 14A:
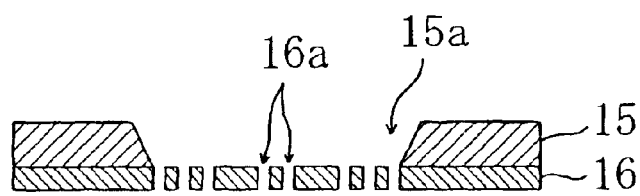
FIG. 14 is another process cross-sectional view showing the method for manufacturing the multi-layer structured exposure mask according to Embodiment 4.

First, in the process shown in FIG. 14(a), the silicon plate 15 having a large opening 15a and the heat absorption mask 16 provided with openings 16a formed in almost the same pattern as the pattering openings 13a provided for the X-ray shielding metal film 13, which will be described later, are prepared. More specifically, a heat absorption mask plate (SiN film) is formed on the under surface of the silicon plate 15 using a CVD method, etc. Then, the heat absorption mask 16 is formed by patterning the openings 16a that penetrate the heat absorption mask plate. Then, a large opening 15a is formed in the silicon plate 15 in such a way that the openings 16a of the heat absorption mask 16 are exposed.

Figure 14B:
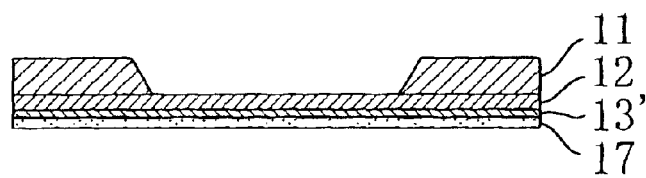

In the process shown in FIG. 14(b), the membrane 12 and X-ray shielding metal plate 13' are formed one by one on the under surface of the silicon plate 11 using a CVD method, etc. Then, a large opening is formed in the silicon plate 11 in such a way that the upper surface of the membrane 12 is exposed. Then, a resist 17 is formed on the under surface of the X-ray shielding metal plate 13'.

Figure 14C:
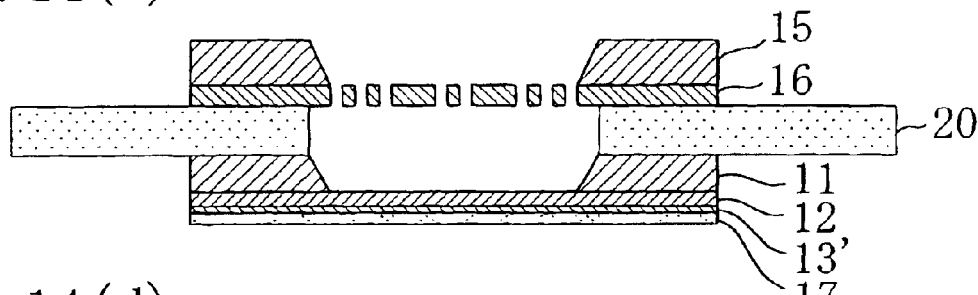

Then, in the process shown in FIG. 14(c), the frame 20 made of glass and having a large opening is prepared. Then, the upper surface of the frame 20 is pasted to the under surface of the heat absorption mask 16 on the upper surface of which the silicon plate 15 obtained in the process shown in FIG. 14(a) is provided. Then, the under surface of the frame 20 is pasted to the upper surface of the silicon plate 11 on the under surface of which the membrane 12, X-ray shielding metal plate 13' and the resist 17 obtained in the process shown in FIG. 14(b) are provided.

Figure 14D:
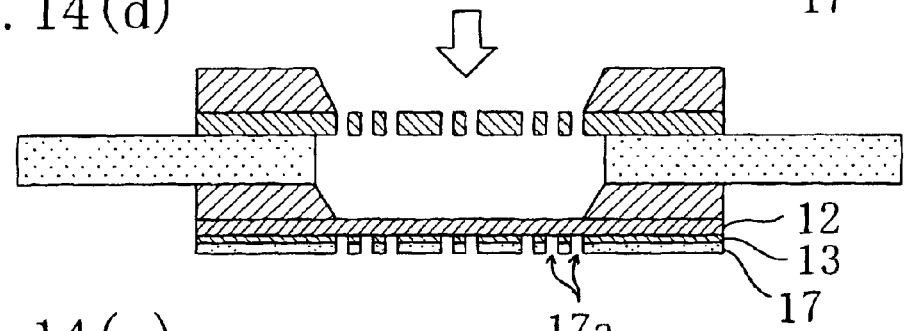

Then, in the process shown in FIG. 14(d), X-rays are irradiated from the direction shown by an arrow in the drawing and the resist 17 is subject to a photoreaction in a self-aligning way through the heat absorption mask 16. At this time, X-rays with intensity capable of penetrating the X-ray shielding metal plate 13' are irradiated and the resist 17 located below the openings 16a is subject to a photoreaction. X-rays used in this process have much higher intensity than X-rays used in a normal X-ray exposure apparatus.

Then, the resist is developed to form resist openings 17a.

Figure 14E:
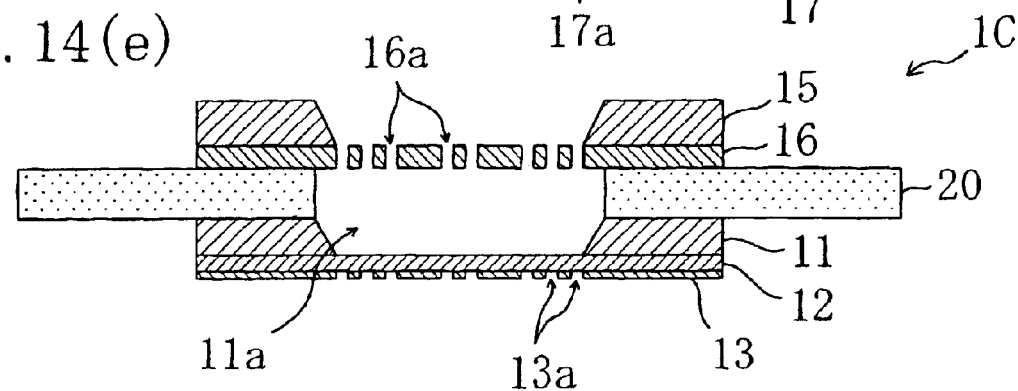

Then, in the process shown in FIG. 14(e) dry etching is applied using the resist 17 in which the resist openings 17a are formed as the mask to form the X-ray shielding metal film 13 having patterning openings 13a formed in almost the same pattern as the openings 16a. Then, by removing the resist 17, the multi-layer structured exposure mask 1C of this embodiment is obtained.

According to this method, the X-ray shielding metal film 13 is formed based on the heat absorption mask 16, and therefore there is no deed to align the openings 16a of the heat absorption mask 16 and the patterning openings 13a of the X-ray shielding metal film 13. This significantly reduces the possibility that there will be a positional difference between the openings 16a and the patterning openings 13a compared to the method 1C. That is, this method provides the multi-layer structured exposure mask 1C with the openings 16a and the patterning openings 13a aligned with high accuracy.

This method uses either an anode junction or an adhesive as the technique for pasting the frame 20, silicon plate 15, heat absorption mask 16, silicon plate 11, membrane 12 and X-ray shielding metal film 13 to each other.

Embodiment 5

Configuration of Multi-Layer Structured Exposure Mask

Figure 15:
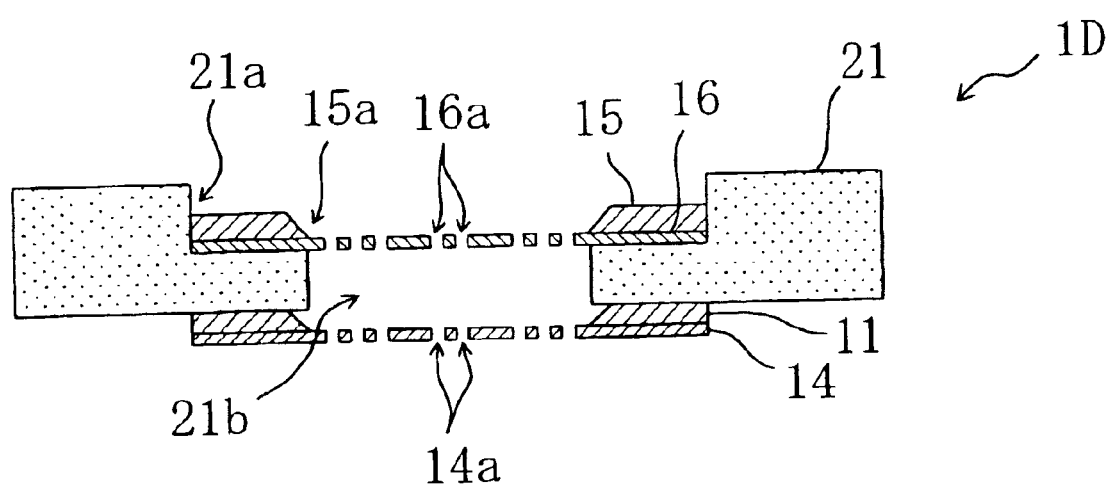
FIG. 15 is a cross-sectional view of a multi-layer structured exposure mask according to Embodiment 5.
Figure 16:
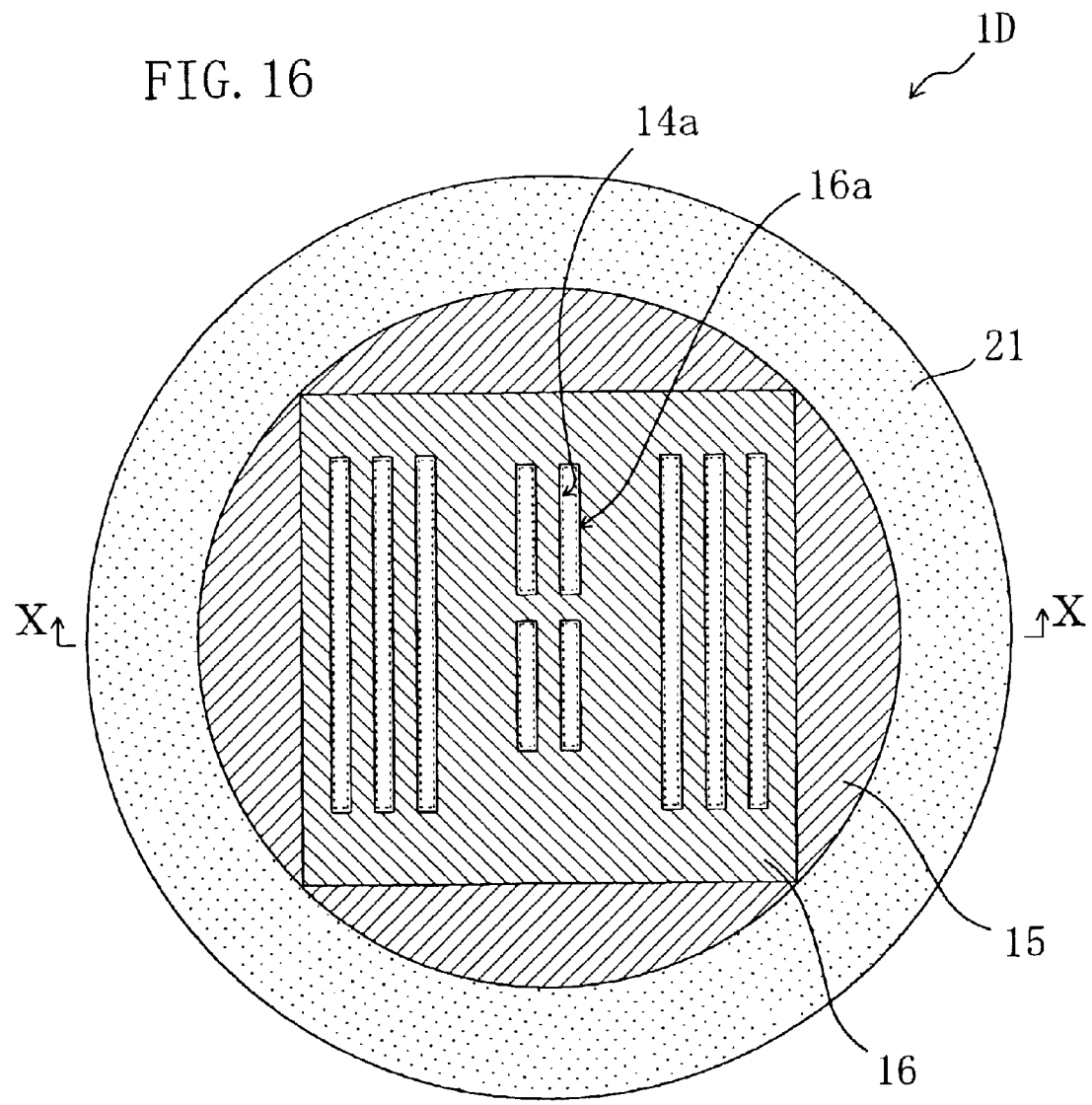
FIG. 16 is a top view of the multi-layer structured exposure mask according to Embodiment 5.

This embodiment will be explained with reference to FIG. 15 and FIG. 16. FIG. 15 is a cross-sectional view showing a configuration of a multi-layer structured exposure mask according to this embodiment. FIG. 16 is a top view of the multi-layer structured exposure mask according to this embodiment and a cross-sectional view along a line X—X in the drawing corresponds to FIG. 15. The multi-layer structured exposure mask of this embodiment is used for an electron beam exposure apparatus.

As shown in FIG. 15, the multi-layer structured exposure mask 1D of this embodiment is provided with a frame 21 made of glass, a silicon plate 11 provided on the under surface of the frame 21, a stencil mask 14 provided on the under surface of the silicon plate 11, a heat absorption mask 16 provided on the upper surface of the frame 21 and a silicon plate 15 provided on the upper surface of the heat absorption mask 16.

The stencil mask 14 is formed of a silicon substrate and provided with slit-shaped patterning openings 14a to form a resist pattern.

The heat absorption mask 16 is formed of a silicon substrate coated with an SiN film and provided with openings 16a formed in almost the same pattern as the patterning openings 14a of the stencil mask 14. The opening 16a is formed in such a size as to prevent electron beams necessary to form resist patterns from being blocked. That is, the size of the opening 16a is the same as the size of the patterning opening 14a or the size of the opening 16a is a little larger.

The frame 21 has a concave section 21a. The size of the concave section 21a is almost the same as that of the silicon plate 15 and the heat absorption mask 16. The silicon plate 15 and heat absorption mask 16 are fitted in the concave section 21a.

Furthermore, the multi-layer structured exposure mask 1B of this embodiment is provided with a hollow section 21b that penetrates the frame 21 and the silicon plate 11 and exposes an area of the under surface of the heat absorption mask 16 in which the openings 16a are formed and an area of the upper surface of the stencil mask 14 in which the patterning openings 14a are formed.

In the multi-layer structured exposure mask 1D of this embodiment, the patterning openings 14a of the stencil mask 14 and the openings 16a of the heat absorption mask 16 are aligned in the horizontal direction as shown in FIG. 16.

The multi-layer structured exposure mask 1D of this embodiment is set with the frame 21 facing the electron beam 31 side of the EB exposure apparatus 100 as in the case of the multi-layer structured exposure mask 1 of Embodiment 1. At this time, electron beams that have passed through the openings 16a pass through the patterning openings 14a.

As is apparent from the explanations, the multi-layer structured exposure mask 1D of this embodiment has almost the same structure as that of the multi-layer structured exposure mask 1B of Embodiment 3 and the components are the same as those of Embodiment 1. However, this embodiment is different from the multi-layer structured exposure mask 1B of Embodiment 3 in that the silicon plate 15 and heat absorption mask 16 are fitted in the concave section 21a of the frame 21.

As in the case of the multi-layer structured exposure mask 1B of Embodiment 3, the multi-layer structured exposure mask 1D of this embodiment is provided with the heat absorption mask 16. This suppresses deformation of the stencil mask 14 due to thermal expansion just like the multi-layer structured exposure mask 1 of Embodiment 1, allowing more accurate formation of resist patterns.

Furthermore, the heat absorption mask 16 and stencil mask 14 are separated by the hollow section 11a and do not directly touch each other. For this reason, almost no heat generated in the heat absorption mask 16 is transmitted to the stencil mask 14 but dissipated to the outside through the silicon plate 15 and frame 20. This suppresses or prevents deformation of the stencil mask 14.

Especially, the size of the concave section 21a is almost the same as that of the silicon plate 15 and the heat absorption mask 16 and the silicon plate 15 and the heat absorption mask 16 are fitted in the concave section 21a. For this reason, the silicon plate 15 and the heat absorption mask 16 are securely fixed. This allows accurate alignment between the patterning openings 14a and the openings 16a.

By the way, the modification example described in Embodiment 1 is also applicable to the multi-layer structured exposure mask 1D of this embodiment and the same effect can also be obtained by the modification thereof.

Manufacturing Method

Figure 17:
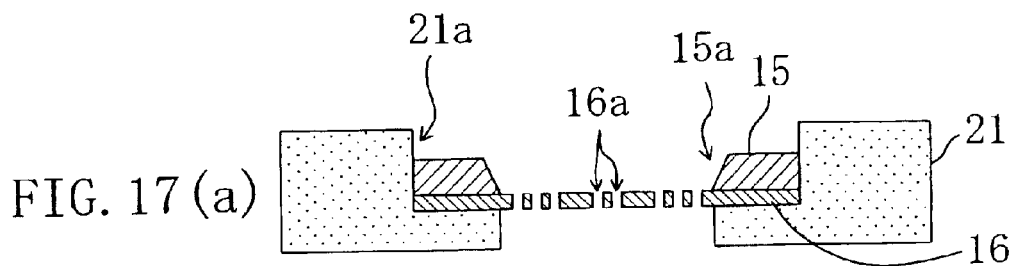
FIG. 17 is a process cross-sectional view showing a method for manufacturing the multi-layer structured exposure mask according to Embodiment 5.
Figure 17:
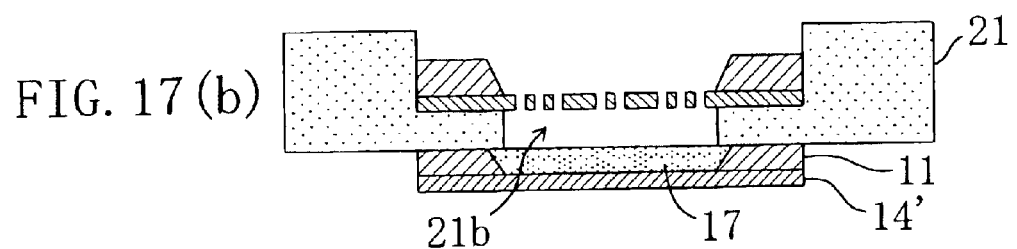
Figure 17:
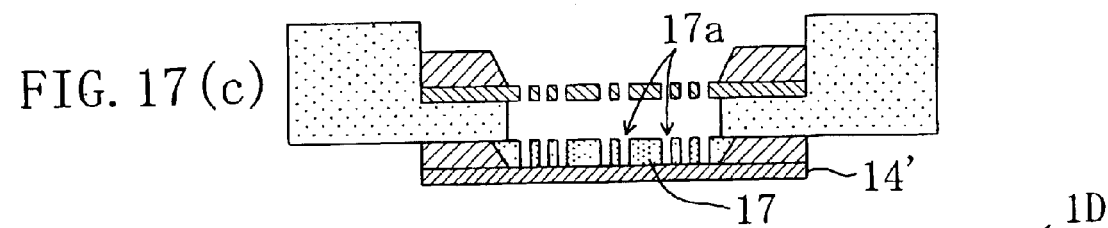
Figure 17:
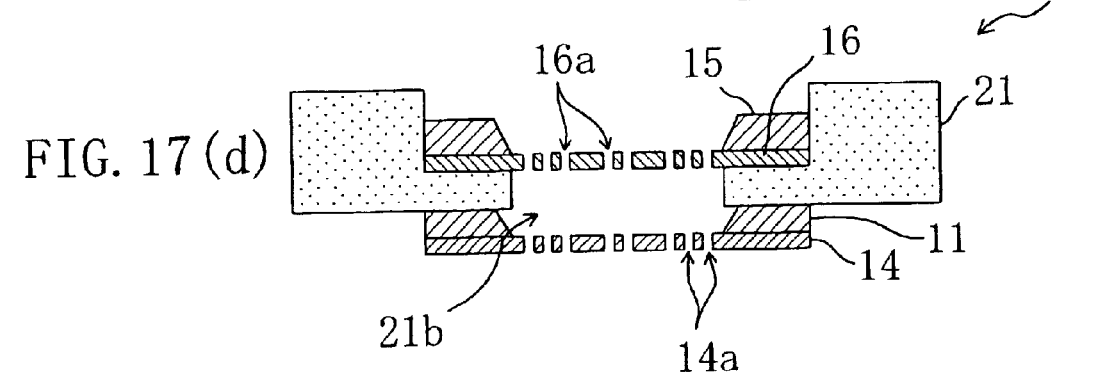

Then, the method for manufacturing the multi-layer structured exposure mask 1D of this embodiment will be explained with reference to FIG. 17. FIG. 17 is a process cross-sectional view showing the method for manufacturing the multi-layer structured exposure mask 1D according to this embodiment.

First, in the process shown in FIG. 17(a), the silicon plate 15 having a large opening 15a, the heat absorption mask 16 having openings 16a formed in almost the same pattern as the pattering openings 14a provided for the stencil mask 14, which will be described later, are prepared. More specifically, a heat absorption mask plate (SiN film) is formed on the under surface of the silicon plate 15 using a CVD method, etc. Then, the heat absorption mask 16 is formed by patterning the openings 16a that penetrate the heat absorption mask plate. Then, a large opening 15a is formed in the silicon plate 15 in such a way that the openings 16a of the heat absorption mask 16 are exposed.

Then, the frame 21 made of glass having a concave section 21a and a large opening in the concave section 21a is prepared, the heat absorption mask 16 on the upper surface of which the silicon plate 15 is provided is fitted in the concave section 21a. At this time, the under surface of the heat absorption mask 16 is pasted to the bottom face of the concave section 21a of the frame 21.

Then, in the process shown in FIG. 17(b), the silicon plate 11 provided with a large opening almost as large as the large opening of the frame 21 and the stencil mask plate 14' are prepared. More specifically, a silicon plate 11 on the under surface of which a silicon oxide film is formed is prepared and a stencil mask plate 14' (Si film) is formed on the silicon oxide film using a CVD method, etc. Then, a large opening is formed in the silicon plate 11 in such a way that the upper surface of the stencil mask plate 14' is exposed. Then, the silicon plate 11 is pasted to the under surface of the frame 21. At this time, alignment is performed in such a way that the large opening of the frame 21 is aligned with the large opening of the silicon plate 11.

In this process, it is also possible to form the resist 17 on the upper surface of the stencil mask 14' after pasting the silicon plate 11 on the under surface of the frame 21.

Then, in the process shown in FIG. 17(c), X-rays are irradiated from the direction shown by an arrow in the drawing and the resist 17 is subject to a photoreaction in a self-aligning way through the heat absorption mask 16. Then, the resist is developed to form resist openings 17a.

Then, in the process shown in FIG. 17(d), dry etching is applied using the resist 17 in which the resist openings 17a are formed as the mask to form a stencil mask 14 having patterning openings 14a formed in almost the same pattern as the openings 16a.

In the processes, the multi-layer structured exposure mask 1D of this embodiment is obtained.

According to this method, the stencil mask 14 is formed based on the heat absorption mask 16, and therefore there is no need to align the openings 16a of the heat absorption mask 16 and the patterning openings 14a of the stencil mask 14. Particularly since the heat absorption mask 16 is fitted in the concave section 21a and fixed, there is almost no possibility that there will be a positional difference between the openings 16a and patterning openings 14a. That is, this method provides the multi-layer structured exposure mask 1D in which the openings 16a match the patterning openings 14a with high accuracy.

This method uses either an anode junction or an adhesive as the technique for pasting the frame 21, silicon plate 15, heat absorption mask 16, silicon plate 11, and stencil mask 14 to each other.

Furthermore, as another method for manufacturing the multi-layer structured exposure mask 1D of this embodiment, it is also possible to use a method for pasting the silicon plate 11 to the under surface of the frame 21 and pasting the stencil mask 14 while aligning the openings 16a and patterning openings 14a after the process shown in FIG. 7(a).

As described above, this embodiment has described the exposure mask for an electron beam exposure apparatus, but it is also possible to provide the exposure mask for an X-ray exposure apparatus by providing a laminated film with an X-ray shielding metal film provided with a membrane and patterning openings instead of the stencil mask 14.

Embodiment 6

Figure 18:
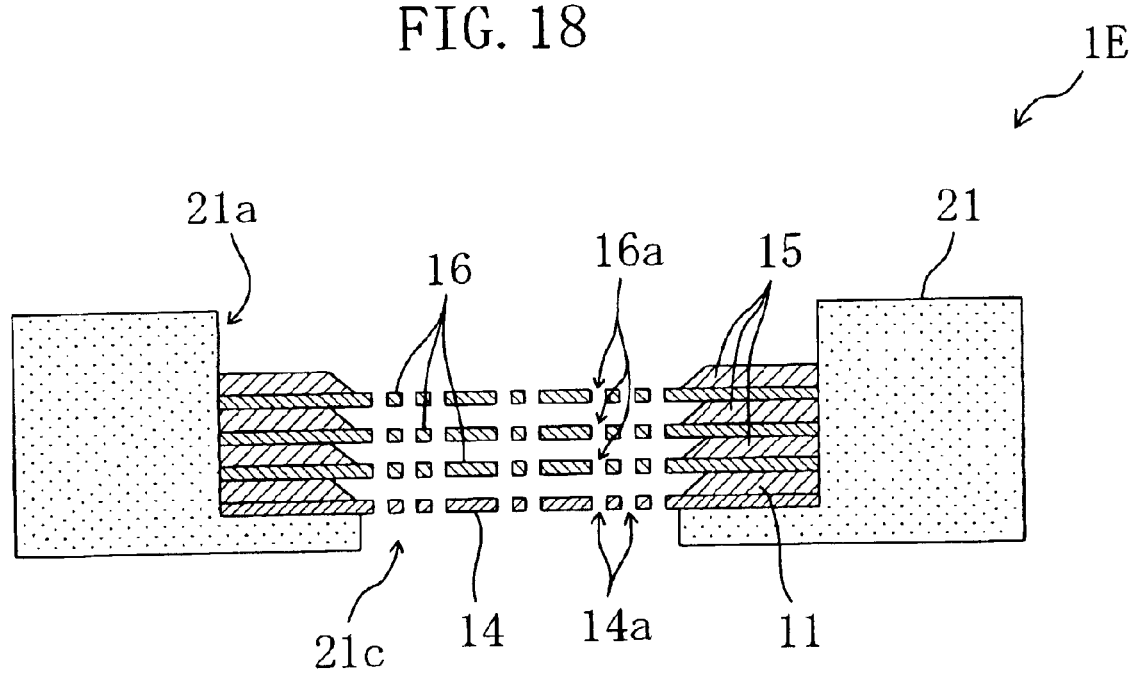
FIG. 18 is a cross-sectional view showing a configuration of a multi-layer structured exposure mask according to Embodiment 6.

This embodiment will be explained with reference to FIG. 18. FIG. 18 is a cross-sectional view showing a configuration of a multi-layer structured exposure mask according to this embodiment. The multi-layer structured exposure mask 1E of this embodiment is used for an electron beam exposure apparatus.

As shown in FIG. 18, the multi-layer structured exposure mask 1E of this embodiment is provided with a frame 21 provided with a concave section 21a, a stencil masks 14, a silicon plate 11, a heat absorption masks 16 and a silicon plates 15 provided in that order from the bottom face side within the concave section 21a. Especially, this embodiment provides three heat absorption masks 16 forming one body with the silicon plates 15, but a heat absorption effect can be achieved only with at least one heat absorption mask 16.

The stencil mask 14 is formed of a silicon substrate and provided with slit-shaped patterning openings 14a to form a resist pattern.

The heat absorption mask 16 is formed of a silicon substrate coated with an SiN film and provided with openings 16a formed in almost the same pattern as the patterning openings 14a of the stencil mask 14. The openings 16a are formed in such a size as to prevent electron beams necessary to form resist patterns from being blocked. That is, the size of the opening 16a is the same as the size of the patterning opening 14a or the size of the opening 16a is a little larger.

Both the silicon plates 11 and 15 have a large opening. The large opening of the silicon plate 11 is provided in the area of the upper surface of the stencil mask 14 in which the patterning openings 14a are formed. On the other hand, the large opening of the silicon plate 15 is provided in the area of the upper surface of the heat absorption mask 16 in which the openings 16a are formed. The silicon plates 11 and 15 provide space between the stencil mask 14 and the heat absorption mask 16 and between the two heat absorption masks 16.

The size of the concave section 21a of the frame 21 is almost the same as that of the stencil mask 14, the silicon plate 11, the heat absorption mask 16 and the silicon plate 15. Furthermore, a large opening 21c is provided inside the concave section 21a and the large opening 21c exposes the area of the under surface of the stencil mask 14 in which the patterning openings 14a are formed.

In the multi-layer structured exposure mask 1E of this embodiment, the patterning openings 14a of the stencil mask 14 and the openings 16a of the heat absorption mask 16 are aligned in the horizontal direction.

The multi-layer structured exposure mask 1E of this embodiment is set with the frame 21 facing the electron gun 31 side of the EB exposure apparatus 100 as in the case of the multi-layer structured exposure mask 1 of Embodiment 1. At this time, electron beams that have passed through the openings 16a pass through the patterning openings 14a.

As is apparent from the explanations, the multi-layer structured exposure mask 1E of this embodiment has almost the same structure as that of the multi-layer structured exposure mask 1D of Embodiment 5 and the components are the same as those of Embodiment 1. However, this embodiment is different from the multi-layer structured exposure mask 1D of Embodiment 5 in that the silicon plate 11, stencil mask 14, a plurality of silicon plates 15 and heat absorption masks 16 are fitted in the concave section 21a of the frame 21.

As in the case of the multi-layer structured exposure mask 1D of Embodiment 5, the multi-layer structured exposure mask 1E of this embodiment is provided with the heat absorption mask 16. This suppresses deformation of the stencil mask 14 due to thermal expansion just like the multi-layer structured exposure mask 1D of Embodiment 5, allowing more accurate formation of resist patterns. Especially since this embodiment provides a plurality of heat absorption masks 16, the efficiency of heat absorption is enhanced. For this reason, deformation of the stencil mask 14 due to thermal expansion is further suppressed.

Furthermore, the heat absorption mask 16 and stencil mask 14 are separated by the hollow section 11a and do not directly touch each other. For this reason, almost no heat generated in the heat absorption mask 16 is transmitted to the stencil mask 14 but dissipated to the outside through the silicon plate 15 and frame 20. This suppresses or prevents deformation of the stencil mask 14.

Furthermore, the size of the concave section 21a in this embodiment is almost the same as that of the silicon plate 11, stencil mask 14, silicon plate 15 and the heat absorption mask 16 and the silicon plate 15 and the heat absorption mask 16 are fitted in the concave section 21a. For this reason, the silicon plate 15 and the heat absorption mask 16 are securely fixed. This allows accurate alignment between the patterning opening 14a and the opening 16a.

By the way, the modification example described in Embodiment 1 is also applicable to the multi-layer structured exposure mask 1E of this embodiment and the same effect can also be obtained by the modification thereof.

Manufacturing Method

Then, the method for manufacturing the multi-layer structured exposure mask 1E of this embodiment will be explained with reference to FIG. 19. FIG. 19 is a process cross-sectional view showing the method for manufacturing the multi-layer structured exposure mask 1E according to this embodiment.

Figure 19A:
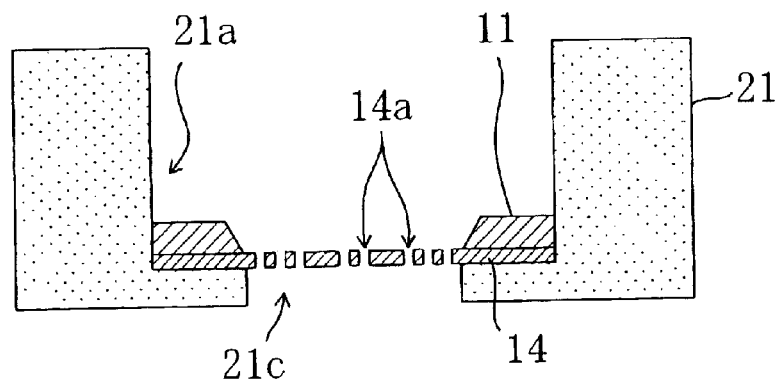
FIG. 19 is a process cross-sectional view showing a method for manufacturing the multi-layer structured exposure mask according to Embodiment 6.

First, in the process shown in FIG. 19(a), the silicon plate 11 having a large opening and a stencil mask 14 having patterning openings 14a are prepared. More specifically, the silicon plate 11 with a silicon oxide film formed on the under surface is prepared and a stencil mask plate (Si film) is formed on the silicon oxide film using a CVD method, etc. Then, the stencil mask 14 is formed by forming the patterning openings 14a that penetrate the stencil mask plate. Then, a large opening is formed in the silicon plate 11 in such a way that the patterning openings 14a of the stencil mask 14 are exposed.

Then, a frame 21 made of glass and provided with a concave section 21a almost as large as the stencil mask 14 and further including a large opening 21c inside the concave section 21a is prepared. Then, the stencil mask 14 on the upper surface of which the silicon plate 11 is provided is fitted in the concave section 21a. At this time, the under surface of the stencil mask 14 is pasted to the bottom face of the concave section 21a.

Figure 19B:
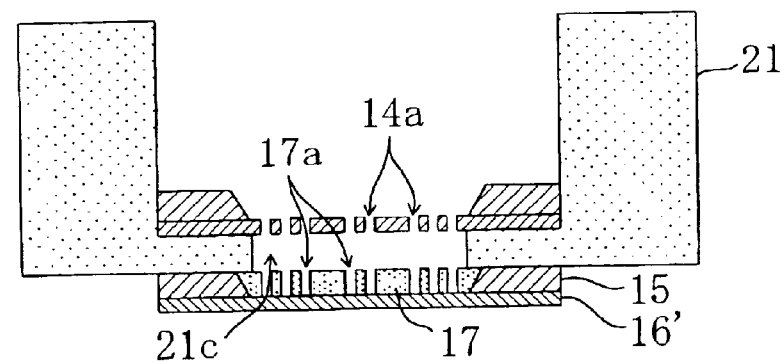

Then, in the process shown in FIG. 19(b), a silicon plate 15 provided with a large opening almost as large as the large opening 21c of the frame 21 and a heat absorption mask plate 16' are prepared. More specifically, a heat absorption mask plate 16' is formed on the under surface of the silicon plate 15 using a CVD method, etc. first. Then, a large opening is formed in the silicon plate 15 in such a way that the upper surface of the heat absorption mask plate 16' is exposed. Then, a resist 17 is formed on the upper surface of the heat absorption mask plate 16' exposed within the large opening of the silicon plate 15.

Then, the silicon plate 15 is pasted to the under surface of the frame 21. At this time, alignment is performed in such a way that the large opening 21c of the frame 21 matches the large opening of the silicon plate 15. Then, X-rays are irradiated through the stencil mask 14 and the resist 17 is subject to a photoreaction in a self-aligning way. Then, the resist 17 is developed to form resist openings 17a.

In this process, it is also possible to form the resist 17 on the upper surface of the heat absorption mask plate 16' after pasting the under surface of the frame 21 to the upper surface of the silicon plate 15.

This embodiment repeats the process shown in FIG. 19(b) three times.

Figure 19C:
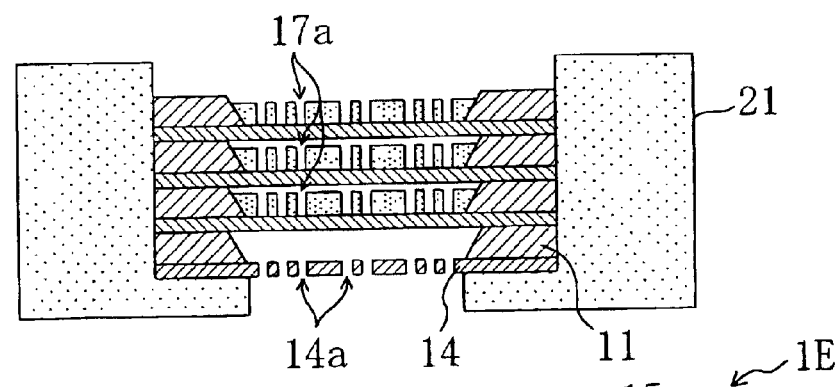

Then, in the process shown in FIG. 19(c), the heat absorption mask plates 16' provided with the three patterned resists 17 obtained in the process shown in FIG. 19(b) are fitted in the concave section 21a of the frame 21.

Figure 19D:
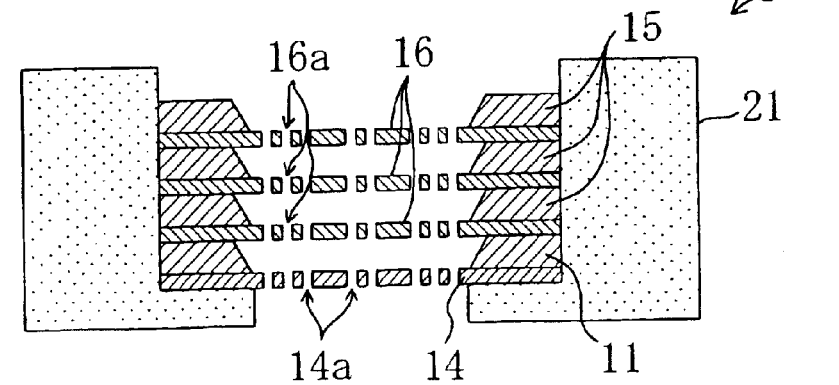

Then, in the process shown in FIG. 19(d), dry etching is applied using the resist 17 in which the resist openings 17a are formed as the mask to form three heat absorption masks 16 having patterning openings 16a formed in almost the same pattern as the patterning openings 14a.

In the processes, the multi-layer structured exposure mask 1E of this embodiment is obtained.

According to this method, the heat absorption mask 16 is formed based on the stencil mask 14, and therefore there is no need to align the openings 16a of the heat absorption mask 16 with the patterning openings 14a of the stencil mask 14. Furthermore, the stencil mask 14 and the heat absorption mask 16 are fitted in the concave section 21a and fixed according to this embodiment, and therefore there is little possibility that there will be a positional difference between the openings 16a and patterning openings 14a. That is, this method provides the multi-layer structured exposure mask 1E in which the openings 16a match the patterning openings 14a with high accuracy.

Furthermore, it is also possible to apply dry etching using the resist 17 in which the resist openings 17a are formed as the mask to form the heat absorption mask 16 in the process shown in FIG. 19(b), and fit the heat absorption mask 16 obtained in the process shown in FIG. 19(b) in the concave section 21a of the frame 21 in the process shown in FIG. 19(c) and remove the resist 17 in the process shown in FIG. 19(d).

This method uses either an anode junction or an adhesive as a technique for pasting the frame 21, silicon plate 15, heat absorption mask 16, silicon plate 11 and stencil mask 14 to each other.

Modification Example

As shown above, this embodiment has described the exposure mask for an electron beam exposure apparatus, but it is also possible to provide the exposure mask for an X-ray exposure apparatus by providing a laminated film with an X-ray shielding metal film provided with a membrane and patterning openings instead of the stencil mask 14.

Moreover, this embodiment has a configuration with three heat absorption masks 16, but at least one heat absorption mask 16 can display a heat absorption effect.

Embodiment 7

Figure 20:
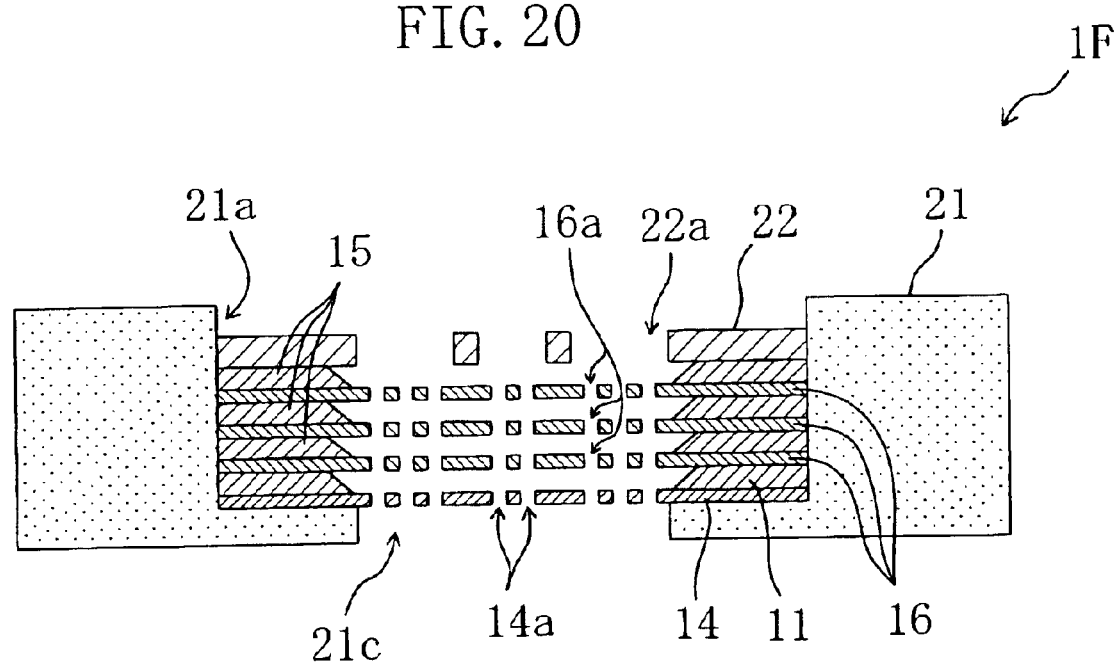
FIG. 20 is a cross-sectional view showing a configuration of a multi-layer structured exposure mask according to Embodiment 7.
Figure 21:
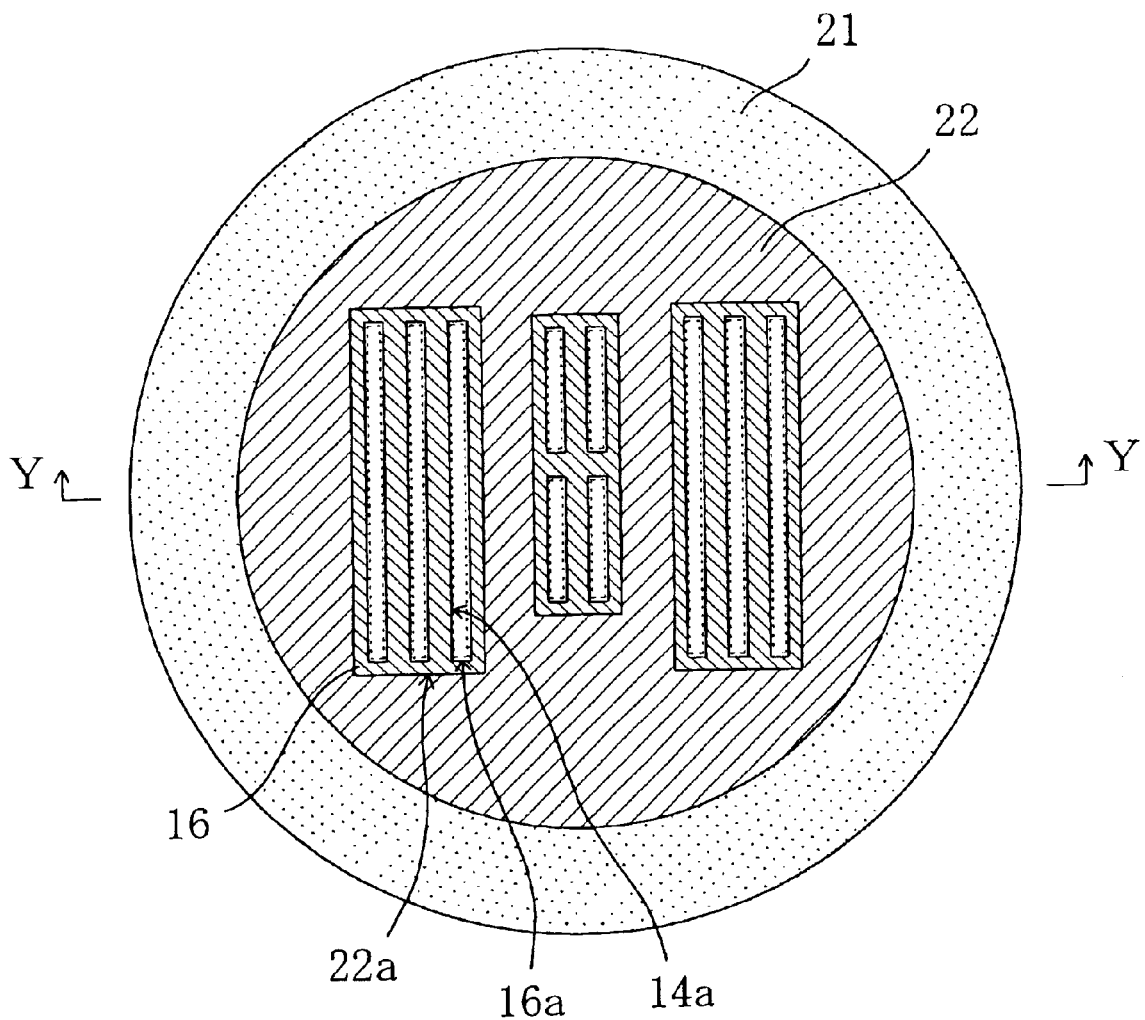
FIG. 21 is a top view showing the configuration of the multi-layer structured exposure mask according to Embodiment 7.

This embodiment will be explained with reference to FIG. 20. FIG. 20 is a cross-sectional view showing a configuration of a multi-layer structured exposure mask according to this embodiment. FIG. 21 is a top view of the multi-layer structured exposure mask 1F of this embodiment and the sectional view along the Y—Y line in the drawing corresponds to FIG. 20.

As shown in FIG. 20, the multi-layer structured exposure mask 1F of this embodiment is provided with a frame 21 with a concave section 21a, a stencil mask 14, a silicon plate 11, heat absorption masks 16 and silicon plates 15 and a metal cover 22 provided in that order from the bottom face side inside the concave section 21a. Especially, this embodiment provides three heat absorption masks 16 forming one body with the silicon plates 15, but a heat absorption effect can be achieved only with at least one heat absorption mask 16.

The stencil mask 14 is formed of a silicon substrate and slit-shaped patterning openings 14a to form resist patterns.

The heat absorption mask 16 is formed of a silicon substrate coated with an SiN film and provided with openings 16a formed in almost the same pattern as the patterning openings 14a of the stencil mask 14. The opening 16a is formed in such a size as to prevent electron beams necessary to form resist patterns from being blocked. That is, the size of the opening 16a is the same as the size of the patterning opening 14a or the size of the opening 16a is a little larger.

Both the silicon plates 11 and 15 have a large opening. The large opening of the silicon plate 11 is provided in the area of the upper surface of the stencil mask 14 in which the patterning openings 14a are formed. On the other hand, the large opening of the silicon plate 15 is provided in the area of the upper surface of the heat absorption mask 16 in which the openings 16a are formed. The silicon plates 11 and 15 provide space between the stencil mask 14 and the heat absorption mask 16 and between the two heat absorption masks 16.

The metal cover 22 is formed of a tungsten substrate and provided with an opening 22a. As shown in FIG. 21, the opening 22a is larger than the opening 16a of the heat absorption mask 16 so that the metal cover 22 does not block the opening 16a of the heat absorption mask 16.

The size of the concave section 21a of the frame 21 is almost the same as that of the stencil mask 14, silicon plate 11, heat absorption mask 16, silicon plate 15 and metal cover 22. Furthermore, a large opening 21c is provided inside the concave section 21a and the large opening 21c exposes the area of the under surface of the stencil mask 14 in which the patterning openings 14a are formed.

In the multi-layer structured exposure mask 1F of this embodiment, the patterning openings 14a of the stencil mask 14, the openings 16a of the heat absorption mask 16 and the opening 22a of the metal cover 22 are aligned in the horizontal direction as shown in FIG. 21.

The multi-layer structured exposure mask 1F of this embodiment is set with the frame 21 facing the electron gun 31 side of the EB exposure apparatus 100 as in the case of the multi-layer structured exposure mask 1 of Embodiment 1. At this time, electron beams that have passed through the openings 16a pass through the patterning openings 14a.

As is apparent from the explanations, the multi-layer structured exposure mask 1F of this embodiment has almost the same structure as that of the multi-layer structured exposure mask 1E of Embodiment 6. However, this embodiment is different from the multi-layer structured exposure mask 1E of Embodiment 6 in that the metal cover 22 is provided.

As in the case of the multi-layer structured exposure mask 1E of Embodiment 6, the multi-layer structured exposure mask 1F of this embodiment is provided with the heat absorption mask 16. This allows suppression of deformation of the stencil mask 14 due to thermal expansion and more accurate formation of resist patterns similarly as the multi-layer structured exposure mask 1E of Embodiment 6 at all. Especially this embodiment provides the metal cover 22 that blocks most of electron beams that do not pass through the openings 16a and patterning openings 14a. This reduces electron beams irradiated onto the heat absorption masks 16 and stencil mask 14 placed below the metal cover 22. Therefore, deformation due to heat generation in the heat absorption masks 16 and stencil mask 14 is suppressed. This makes it possible to form a resist pattern that reflects the shapes of the patterning openings 14a more accurately.

Furthermore, the heat absorption masks 16 are separated from the stencil mask 14 by the hollow section 11a and do not directly contact each other. Because of this, the heat generated in the heat absorption masks 16 is mostly not transmitted to the stencil mask 14 but dissipated to the outside through the silicone plate 15 and frame 21. This suppresses or prevents deformation of the stencil mask 14.

Furthermore, the size of the concave section 21a of this embodiment is almost the same as the sizes of the silicon plate 11, stencil mask 14, silicon plate 15 and the heat absorption masks 16, and the silicon plate 15 and the heat absorption masks 16 are fitted in the concave section 21a. For this reason, the silicon plate 15 and the heat absorption mask 16 are securely fixed. This allows more accurate alignment between the patterning openings 14a and the openings 16a.

By the way, the modification example described in Embodiment 1 is also applicable to the multi-layer structured exposure mask 1F of this embodiment and the same effect can also be obtained by the modification thereof.

Manufacturing Method

Then, the method for manufacturing the multi-layer structured exposure mask 1F of this embodiment will be explained with reference to FIG. 22. FIG. 22 is a process cross-sectional view showing the method for manufacturing the multi-layer structured exposure mask 1F according to this embodiment.

Figure 22A:
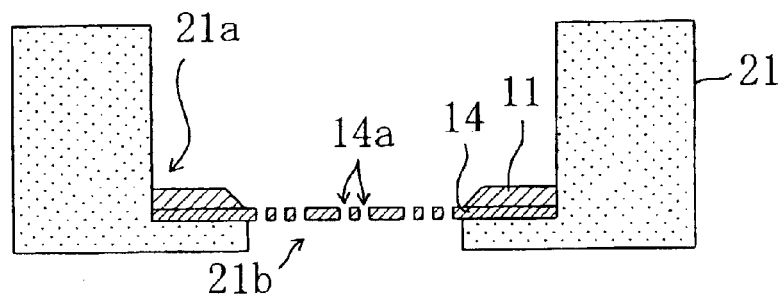
FIG. 22 is a process cross-sectional view showing a method for manufacturing the multi-layer structured exposure mask according to Embodiment 7.

First, in the process shown in FIG. 22(a), the silicon plate 11 having a large opening and the stencil mask 14 provided with the patterning openings 14a are prepared. More specifically, a silicon plate 11 on the under surface of which a silicon oxide film is formed is prepared first and a stencil mask plate (Si film) is formed on the silicon oxide film using a CVD method, etc. Then, the stencil mask 14 is formed by forming patterning openings 14a that penetrate the stencil mask plate. Then, a large opening is formed in the silicon plate 11 in such a way as to expose the patterning openings 14a of the stencil mask 14.

Then, the frame 21 made of glass and having a concave section 21a almost as large as the stencil mask 14 and having a large opening 21c in the concave section 21a is prepared. Then, the stencil mask 14 on the upper surface of which the silicon plate 11 is provided is fitted in the concave section 21a. At this time, the under surface of the stencil mask 14 is pasted to the bottom face of the concave section 21a.

Figure 22B:
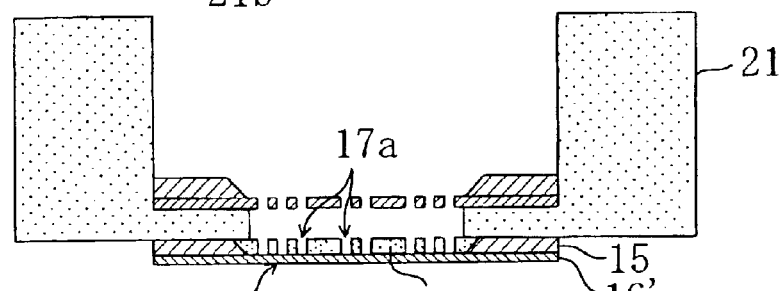

Then, in the process shown in FIG. 22(b), the silicon plate 15 provided with a large opening almost as large as the large opening 21c of the frame 21 and the heat absorption mask plate 16' are prepared. More specifically, the heat absorption mask plate 16' (SiN film) is formed on the under surface of the silicon plate 15 using a CVD method, etc. Then, a large opening is formed in the silicon plate 15 in such a way as to expose the upper surface of the heat absorption mask plate 16'.

Then, the resist 17 is formed on the upper surface of the heat absorption mask plate 16' exposed in the large opening of the silicon plate 15.

Then, the silicon plate 15 is pasted to the under surface of the frame 21. At this time, alignment is performed in such a way that the large opening 21c of the frame 21 matches the large opening of the silicon plate 15. X-rays are irradiated through the stencil mask 14 and the resist 17 is subject to a photoreaction in a self-aligning way. Then, the resist 17 is developed to form resist openings 17a.

By the way, in this process, it is also possible to form the resist 17 on the upper surface of the heat absorption mask plate 16' after pasting the under surface of the frame 20 to the upper surface of the silicon plate 15.

This embodiment repeats the process shown in FIG. 22(b) three times.

Figure 22C:
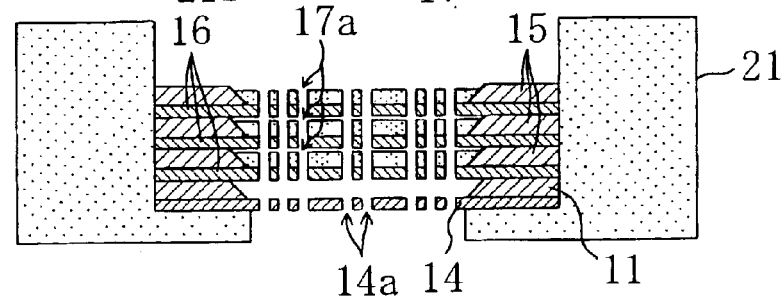

Then, in the process shown in FIG. 22(c), the heat absorption mask plates 16' provided with the three patterned resists 17 obtained in the process shown in FIG. 22(b) are fitted in the concave section 21a of the frame 21.

Figure 22D:
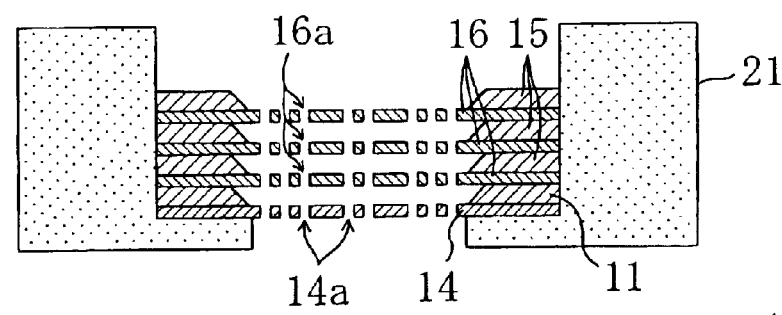

Then, in the process shown in FIG. 22(d), dry etching is applied using the resist 17 in which the resist opening 17a is formed as the mask to form three heat absorption masks 16 having openings 16a formed in almost the same pattern as the pattering openings 14a.

Figure 22E:
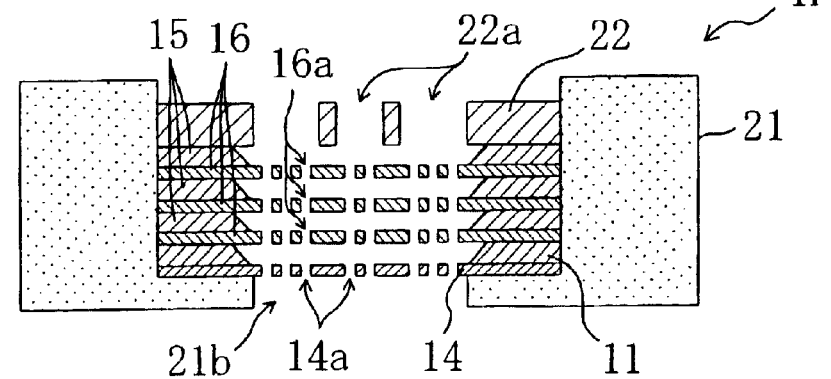

Then, in the process shown in FIG. 22(e), the metal cover 22 formed of a tungsten substrate and provided with openings 22a are fitted in. At this time, the openings 22a are aligned in such a way that the metal cover 22 does not block the openings 16a of the heat absorption mask 16.

In the processes, the multi-layer structured exposure mask 1F of this embodiment is obtained.

According to this method, the heat absorption mask 16 is formed based on the stencil mask 14, and therefore there is no need to align the openings 16a of the heat absorption mask 16 and the patterning openings 14a of the stencil mask 14. Furthermore, the stencil mask 14 and the heat absorption masks 16 are fitted in the concave section 21a and fixed according to this method, and therefore there is little possibility that there will be a positional difference between the openings 16a and patterning openings 14a. That is, this method provides the multi-layer structured exposure mask 1F in which the openings 16a match the patterning openings 14a with high accuracy.

Furthermore, in the process shown in FIG. 22(b), it is also possible to apply dry etching using the resist 17 in which the resist openings 17a are formed as the mask to form the heat absorption mask 16, and fit the heat absorption mask 16 obtained in the process shown in FIG. 22(b) into the concave section 21a of the frame 21 in the process shown in FIG. 22(c) and remove the resist 17 in the process shown in FIG. 22(d).

This method uses either an anode junction or an adhesive as a technique for pasting the frame 21, metal cover 22, silicon plates 15, heat absorption masks 16, silicon plate 11 and stencil mask 14 to each other.

Modification Example

As shown above, this embodiment has described the exposure mask for an electron beam exposure apparatus, but it is also possible to provide the exposure mask for an X-ray exposure apparatus by providing a laminated film with an X-ray shielding metal film provided with a membrane and patterning openings instead of the stencil mask 14.

Moreover, this embodiment has a configuration with three heat absorption masks 16, but only with at least one heat absorption mask 16 this embodiment can display a heat absorption effect.

This embodiment has used the metal cover 22 formed of a tungsten substrate, but the present invention is not limited to this and a material with high thermal conductivity can be used. Examples of the material with high thermal conductivity include a molybdenum substrate, etc.

Exposure Method Using a Plurality of Exposure Masks

Figure 23A:
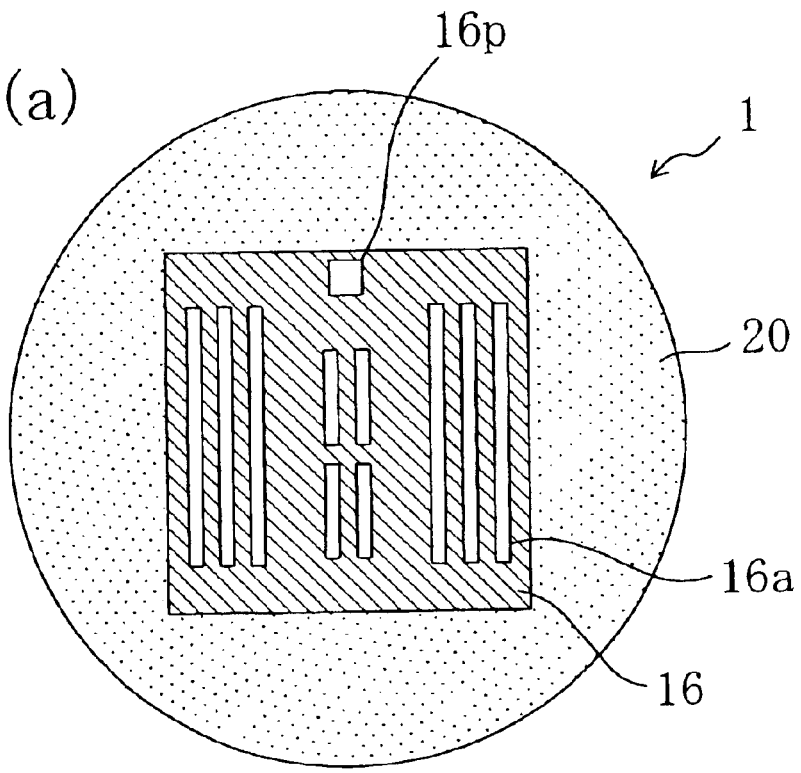
FIG. 23 illustrates an exposure method using a plurality of exposure masks.

The multi-layer structured exposure masks described in the foregoing embodiments are ideally applicable to an exposure method using a plurality of exposure masks. Here, a case where a resist is patterned using two exposure masks having complementary patterning openings will be explained with reference to FIGS. 23(a) and 23(b). FIG. 23(a) is a top view showing the multi-layer structured exposure mask 1 of Embodiment 1 and FIG. 23(b) shows a multi-layer structured exposure mask 1' which is different from the multi-layer structured exposure mask 1 of Embodiment 1 only in the pattern of the openings 16a (patterning openings 14a).

Figure 23B:
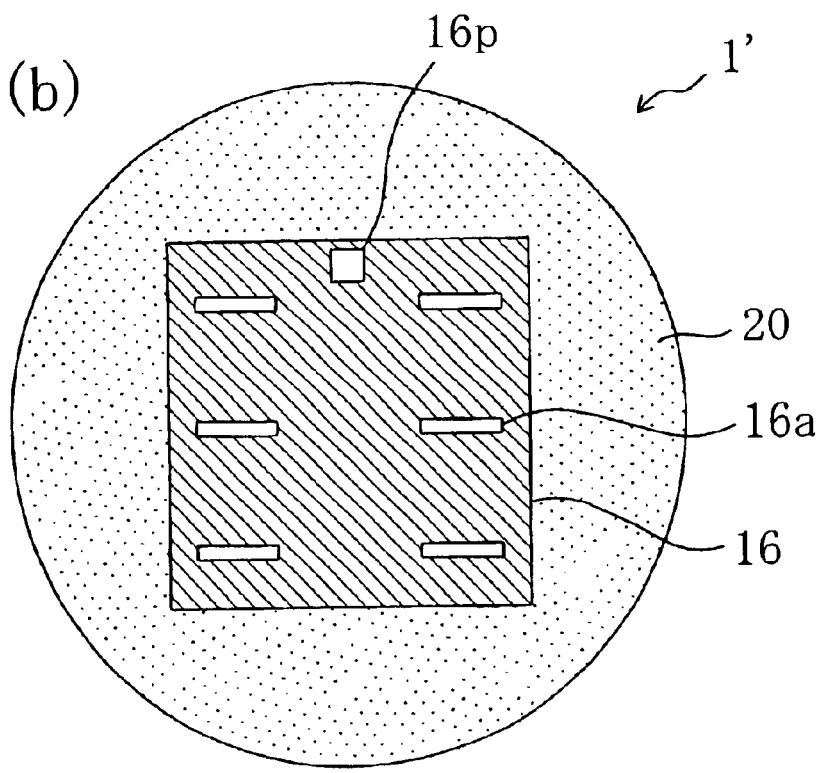

As shown in FIGS. 23(a) and 23(b), the area in which the openings 16a (openings 14a) of the multi-layer structured exposure mask 1' are formed is smaller than the area of the multi-layer structured exposure mask 1 shown in FIG. 23(a). That is, the opening ratio of the heat absorption mask 16 (stencil mask 14) of the multi-layer structured exposure mask 1' is smaller than that of the multi-layer structured exposure mask 1.

In the case of the conventional electron beams exposure mask, there is a difference in the amount of heat generation between an exposure mask with a large area blocking electron beams (small opening ratio) and an exposure mask with a small area blocking electron beams (large opening ratio). Thus, deformation due to heat generation also differs. Therefore, even if the openings of the two exposure masks are aligned, a positional difference is produced due to the difference in deformation due to heat generation. Thus, using a mask of a different opening ratio involves a problem of a large positional difference.

On the other hand, the multi-layer structured exposure masks 1 and 1' differ in the amount of heat generation at the heat absorption mask 16 with a small opening ratio (that is, having a large area blocking electron beams). However, as explained in Embodiment 1, deformation of the pattering mask 14 due to heat generation is suppressed with the multi-layer structured exposure masks 1 and 1', which suppresses a positional difference.

That is, using the multi-layer structured exposure masks of the respective embodiments having a heat absorption mask makes it possible to avoid influences of heat even if the two multi-layer structured exposure masks have different opening ratios and form accurate resist patterns.

Alignment Method

Figure 24A:
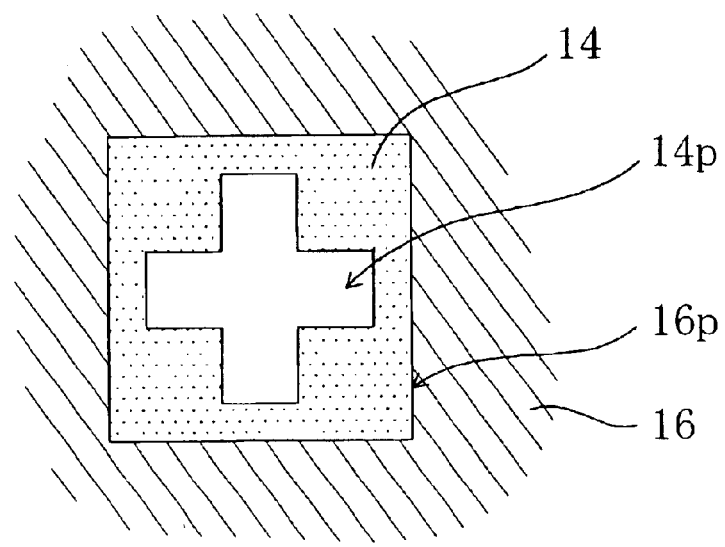
FIG. 24 is an enlarged view of an alignment opening formed on a multi-layer structured exposure mask.
Figure 24B:
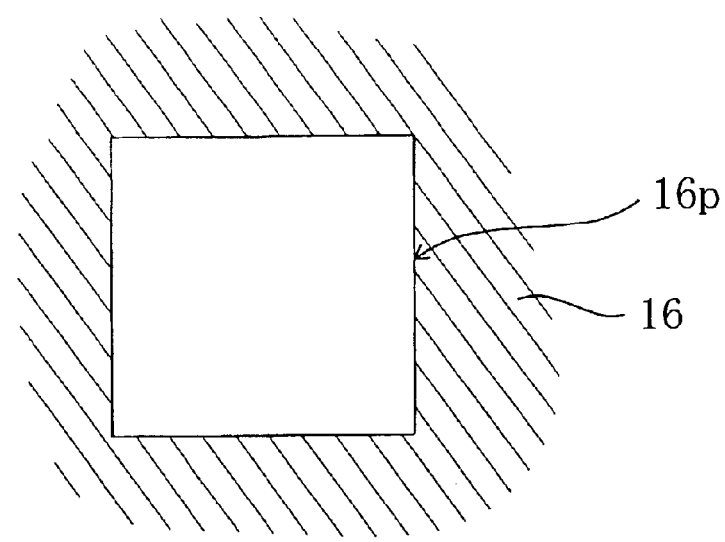
Figure 24C:
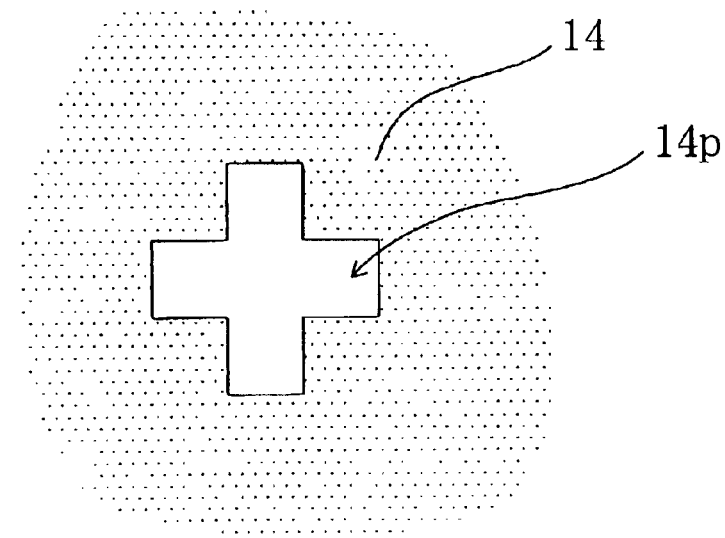

Then, alignment among a plurality of exposure masks according to the exposure method using a plurality of multi-layer structured exposure masks will be explained with reference to FIG. 23 and FIG. 24. FIG. 24 is an enlarged view of the alignment openings formed in the multi-layer structured exposure masks 1 and 1'.

As shown in FIG. 23(*a*) and FIG. 23(*b*), an alignment opening 16*p* is formed in the peripheral area of the heat absorption mask 16 of the multi-layer structured exposure masks 1 and 1'. Right below the alignment opening 16*p*, an alignment opening 14*p* is formed in the peripheral area of the stencil mask 14 as shown in FIG. 24(*a*). FIG. 24(*b*) and 24(*c*) show the alignment openings 16*p* and 14*p* formed in the heat absorption mask 16 and stencil mask 14 respectively and FIG. 24(*a*) is a top view corresponding to a state in which the heat absorption mask 16 is superimposed on the stencil mask 14 (that is, a top view of the peripheral area of the multi-layer structured exposure mask 1 or 1').

When exposure is carried out using the multi-layer structured exposure mask 1 (hereinafter referred to as "first mask") shown in FIG. 23(*a*), and then exposure is carried out using the multi-layer structured exposure mask 1' (hereinafter referred to as "second mask") shown in FIG. 23(*b*), the first mask is aligned with the second mask using a He—Ne laser, etc. A laser is irradiated onto the alignment opening 14*p* formed in the stencil mask 14 for alignment, but the amount of heat generation of the stencil mask 14 by laser irradiation is extremely small. Therefore, there is no need to block the laser beam with the heat absorption mask 16. Thus, the alignment opening 16*p* is made large enough to allow the laser beam to pass through. The alignment opening 16*p* can be arbitrarily shaped so as not to block the alignment opening 14*p* (for example, a square shape including the alignment opening 14*p* as shown in FIG. 24(*a*)).

Here, the multi-layer structured exposure mask of Embodiment 1 is used in this explanation as an example, but it is also possible to provide the alignment openings 14*p* and 16*p* in the multi-layer structured exposure masks according to Embodiment 3, Embodiment 5 to 7. However, in the case of the multi-layer structured exposure mask 1F of Embodiment 7, it is possible to form an alignment opening in the metal cover 22 in an arbitrary shape that will not block the alignment openings 14*p* and 16*p*.

Figure 25:
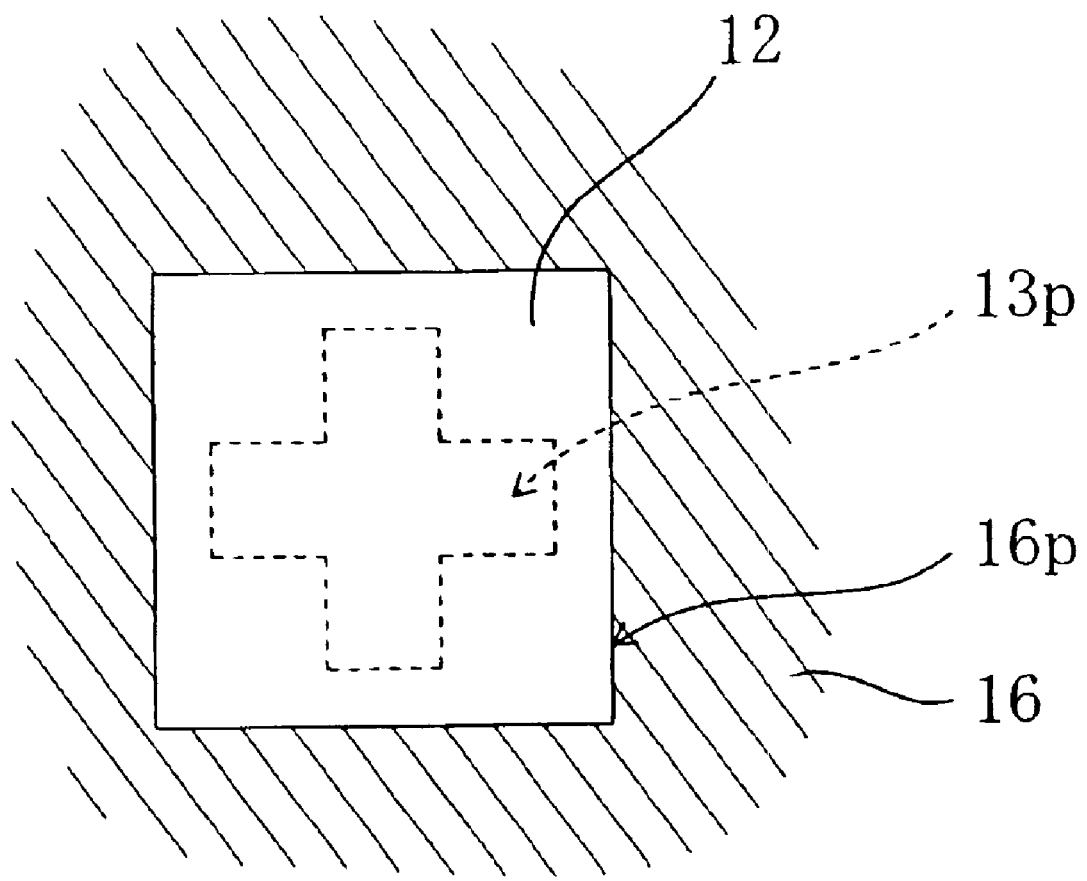
FIG. 25 is an enlarged view of another alignment opening formed on a multi-layer structured exposure mask.
Figure 26:
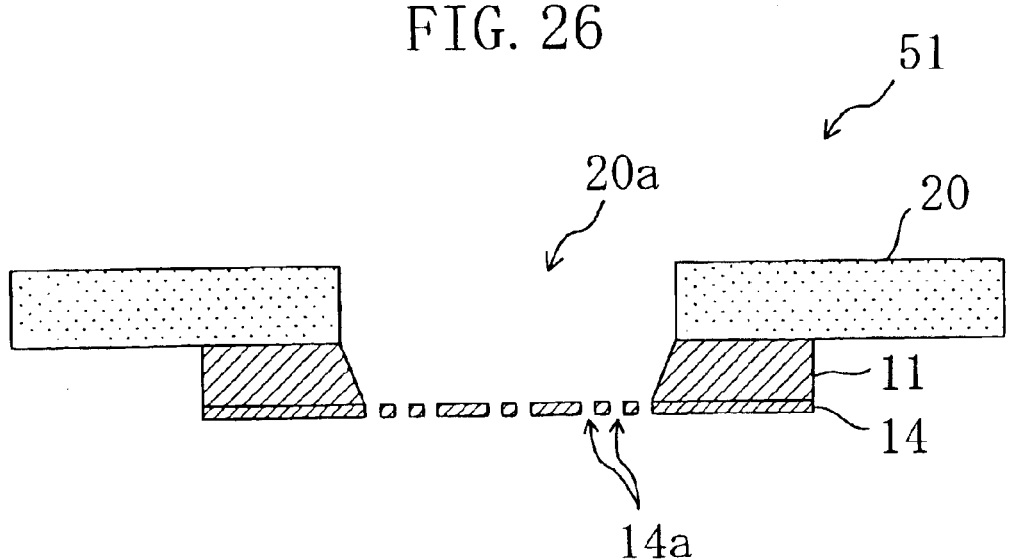
FIG. 26 is a cross-sectional view of a conventional electron beam exposure mask.
Figure 27:
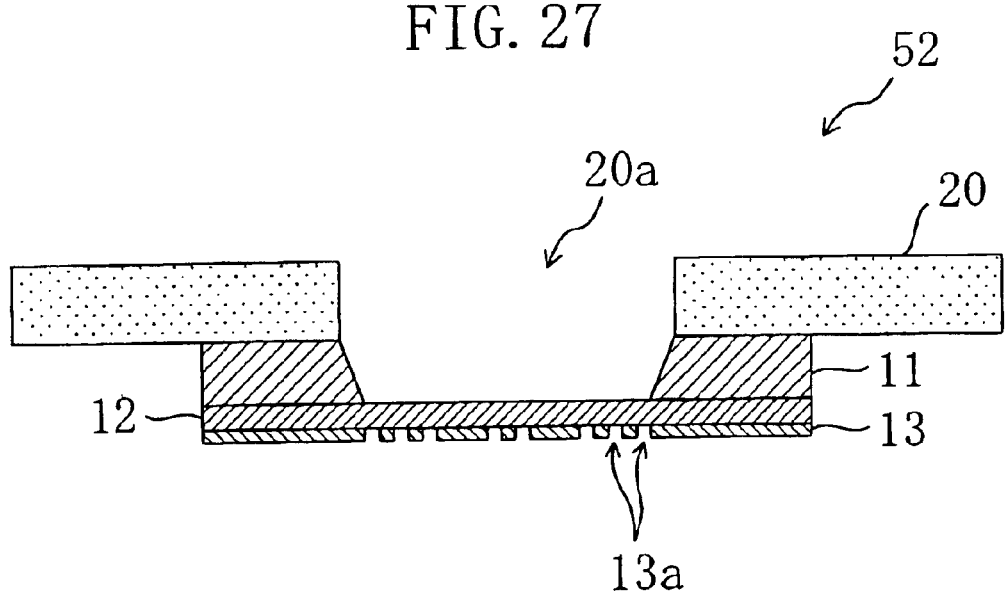
FIG. 27 is a cross-sectional view of an X-ray exposure mask used for a conventional X-ray exposure apparatus.

Furthermore, in the case of the multi-layer structured exposure masks for X-ray exposure according to Embodiments 2 and 4, the alignment opening 13*p* is formed right below the alignment opening 16*p* in the peripheral area of the X-ray shielding metal film 13 as shown in FIG. 25. The laser used for alignment is a laser of a wavelength that penetrates the membrane 12.

INDUSTRIAL APPLICABILITY

The exposure mask of the present invention is used for an exposure apparatus using an exposure light source such as charged particle beams and X-rays.

What is claimed is:

1. An exposure mask, comprising:
   a patterning mask having an opening;
   at least one heat absorption mask having an opening, and
   the opening of the patterning mask is aligned with the opening of the heat absorption mask,
   wherein the thickness of the heat absorption mask is greater than the thickness of the patterning mask, and the heat absorption mask is separated from the patterning mask by a hollow region.

2. The exposure mask according to claim 1, wherein the opening of the heat absorption mask is greater than or as large as the opening of the patterning mask.

3. The exposure mask according to claim 1, wherein the openings of the heat absorption mask and the patterning mask are slit-shaped, and
   the opening of the heat absorption mask is wider than or as wide as the opening of the patterning mask.

4. The exposure mask according to claim 1, wherein the thermal conductivity of the heat absorption mask is greater than that of the patterning mask.

5. The exposure mask according to claim 1, wherein a plurality of the heat absorption masks are provided, and
   the openings of the respective heat absorption masks are aligned with the openings of the patterning mask.

6. The exposure mask according to claim 1, wherein the patterning mask and the heat absorption mask include the same material.

7. The exposure mask according to claim 1, further comprising a metal cover having an opening larger than the opening of the heat absorption mask,
   wherein the metal cover is placed above the heat absorption mask.

8. The exposure mask according to claim 1, wherein an alignment opening is formed in the patterning mask, and
   an opening in a shape different from the alignment opening and larger than the alignment opening is formed in an area of the heat absorption mask located right above the alignment opening.

9. The exposure mask according to claim 1, further comprising a support for supporting the edges of the patterning mask and the heat absorption mask,
   wherein both the patterning mask and the heat absorption mask are placed either above or below the support.

10. The exposure mask according to claim 1, further comprising a support for supporting the edges of the patterning mask and the heat absorption mask,
    wherein the support is inserted between the patterning mask and the heat absorption mask.

11. The exposure mask according to claim 1, wherein a membrane is provided on the upper surface of the patterning mask.

12. An exposure method for irradiating charged particles using an exposure mask comprising:
    a patterning mask having an opening:
    at least one heat absorption mask having an opening; and
    the opening of the patterning mask is aligned with the opening of the heat absorption mask,
    wherein the thickness of the heat absorption mask is greater than the thickness of the patterning mask, the heat absorption mask is separated from the patterning mask by a hollow, and the charged particles are irradiated at an acceleration voltage of 10 keV or above.

13. The exposure method according to claim 12, wherein the charged particles are irradiated at an acceleration voltage of 50 keV or above.

14. An exposure method for irradiating X-rays using an exposure mask comprising:
- a patterning mask having an opening;
- at least one heat absorption mask having an opening, the heat absorption mask being placed above the patterning mask and separated from the patterning mask by a hollow region; and
- a membrane for supporting the patterning mask, where the opening of the patterning mask is aligned with the opening of the heat absorption mask,
- wherein the patterning mask is formed of such a material as to prevent X-rays from penetrating.

15. The exposure method according to claim 14, wherein the X-rays are SOR-X-rays.

16. An exposure mask manufacturing method comprising:
- a step (a) of preparing a heat absorption mask having an opening;
- a step (b) of placing a patterning mask substrate below the heat absorption mask;
- a step (c) of stacking a resist on the under surface of the patterning mask substrate;
- a step (d) of patterning the resist by irradiating radiation penetrating the patterning mask substrate onto the resist using the heat absorption mask as the mask; and
- a step (e) of forming a patterning mask having an opening by etching the patterning mask substrate using the resist as the mask,
- wherein the thickness of the heat absorption mask is greater than the thickness of the patterning mask, and the heat absorption mask is separated from the patterning mask by a hollow region.

17. The exposure mask manufacturing method according to claim 16, wherein in the step (b), a support is inserted between the heat absorption mask and the patterning mask substrate.

18. An exposure mask manufacturing method, comprising:
- a step (a) of preparing a heat absorption mask having an opening;
- a step (b) of providing a plate on the bottom surface of the heat absorption mask;
- a step (c) of providing the patterning mask substrate on the bottom surface of the plate;
- a step (d) of forming a patterning mask having an opening by etching the plate and the patterning mask substrate using the heat absorption mask as the mask; and
- a step (e) of removing a part of the plate located in an area in which the openings of the heat absorption mask and patterning mask are formed,
- wherein in the step (e), the material of the plate has a higher etching speed than both the heat absorption mask and the patterning mask substrate.

19. An exposure mask manufacturing method, comprising:
- a step (a) of placing a heat absorption mask having an opening above the patterning mask substrate on the upper surface of which a resist is formed;
- a step (b) of patterning the resist using the heat absorption mask as the mask; and
- a step (c) of forming a patterning mask having an opening by etching the patterning mask substrate using the resist as the mask,
- wherein the thickness of the heat absorption mask is greater than the thickness of the patterning mask, and the heat absorption mask is separated from the patterning mask by a hollow region.

20. The exposure mask manufacturing method according to claim 19, wherein in the step (a), the heat absorption mask is placed above the patterning mask substrate after a resist is formed on the upper surface of the patterning mask substrate.

21. The exposure mask manufacturing method according to claim 19, wherein in the step (a), the patterning mask substrate on the upper surface of which a resist is formed beforehand is placed below the heat absorption mask after the heat absorption mask is placed.

22. The exposure mask manufacturing method according to claim 19, wherein in the step (a), a support is placed to support the edges of the patterning mask substrate and the heat absorption mask and the heat absorption mask is engaged with the support.

23. An exposure mask manufacturing method, comprising:
- a step (a) of placing a patterning mask having an opening above a heat absorption mask substrate on the upper surface of which a resist is formed;
- a step (b) of patterning the resist using the patterning mask as the mask;
- a step (c) of placing the heat absorption mask substrate above the patterning mask; and
- a step (d) of forming a heat absorption mask having an opening by etching the heat absorption mask substrate using the resist as the mask,
- wherein the thickness of the heat absorption mask is greater than the thickness of the patterning mask, and the heat absorption mask is separated from the patterning mask by a hollow region.

24. The exposure mask manufacturing method according to claim 23, wherein in the step (a), the patterning mask is placed above the heat absorption mask substrate after the resist is formed on the upper surface of the heat absorption mask substrate.

25. The exposure mask manufacturing method according to claim 23, wherein in the step (a), the heat absorption mask substrate on the upper surface of which the resist is formed beforehand is placed below the patterning mask after the patterning mask is placed.

26. The exposure mask manufacturing method according to claim 23, wherein in the step (a), a support is placed to support the edges of the patterning mask and the heat absorption mask substrate, the patterning mask is engaged with the support, and
- in the step (c), the heat absorption mask substrate is engaged with the support.

27. The exposure mask manufacturing method according to claim 23, wherein a step (f) of placing a metal cover having an opening larger than the opening of the heat absorption mask above the heat absorption mask is further included after the step (d).

28. An exposure mask manufacturing method, comprising:
- a step (a) of placing a patterning mask having an opening above the heat absorption mask substrate on the upper surface of which a resist is formed;
- a step (b) of patterning the resist using the patterning mask as the mask;
- a step (c) of forming a heat absorption mask having an opening by etching the heat absorption mask substrate using the resist as the mask; and
- a step (d) of placing the heat absorption mask above the patterning mask, wherein the thickness of the heat absorption mask is greater than the thickness of the patterning mask, and the heat absorption mask is separated from the patterning mask by a hollow region.

29. The exposure mask manufacturing method according to claim 28, wherein in the step (a), the patterning mask is placed above the heat absorption mask substrate after the resist is formed on the upper surface of the heat absorption mask substrate.

30. The exposure mask manufacturing method according to claim 28, wherein in the step (a), the heat absorption mask substrate on the upper surface of which a resist is formed beforehand is placed below the patterning mask after the patterning mask is placed.

31. The exposure mask manufacturing method according to claim 28, wherein in the step (a), a support is placed to support the edges of the patterning mask and the heat absorption mask substrate, the patterning mask is engaged with in the support, and in the step (d), the heat absorption mask is engaged with in the support.

32. The exposure mask manufacturing method according to claim 28, wherein a step (f) of placing a metal cover having an opening larger than the opening of the heat absorption mask above the heat absorption mask is further included after the step (d).

33. The exposure mask according to claim 1, wherein the patterning mask comprises a material to prevent X-rays from penetration.

34. The exposure mask according to claim 33, wherein the X-rays are SOR-X-rays.

35. An exposure mask, comprising:
a patterning mask having an opening;
at least one heat absorption mask having an opening; and
a support for supporting the edges of the patterning mask and the heat absorption mask,
wherein the support is inserted between the patterning mask and the heat absorption mask, and the thickness of the heat absorption mask is greater than the thickness of the patterning mask.

36. The exposure mask according to claim 35, wherein the support further comprises a concave section, and
the heat absorption mask is engaged with the concave section, and is positioned in the concave section.

37. The exposure mask according to claim 35, wherein the support further comprises a concave section, and
the patterning mask is engaged with the concave section, and is positioned in the concave section.

38. The exposure mask according to claim 1, wherein a membrane is provided on the upper surface of the patterning mask.

* * * * *